United States Patent
Heddes et al.

(10) Patent No.: US 9,740,621 B2
(45) Date of Patent: Aug. 22, 2017

(54) MEMORY CONTROLLERS EMPLOYING MEMORY CAPACITY AND/OR BANDWIDTH COMPRESSION WITH NEXT READ ADDRESS PREFETCHING, AND RELATED PROCESSOR-BASED SYSTEMS AND METHODS

(71) Applicant: QUALCOMM Incorporated, San Diego, CA (US)

(72) Inventors: Mattheus Cornelis Antonius Adrianus Heddes, Raleigh, NC (US); Natarajan Vaidhyanathan, Carrboro, NC (US); Colin Beaton Verrilli, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 321 days.

(21) Appl. No.: 14/716,108

(22) Filed: May 19, 2015

(65) Prior Publication Data

US 2015/0339237 A1 Nov. 26, 2015

Related U.S. Application Data

(60) Provisional application No. 62/001,545, filed on May 21, 2014, provisional application No. 62/092,326, (Continued)

(51) Int. Cl.
*G06F 12/00* (2006.01)
*G06F 13/00* (2006.01)
(Continued)

(52) U.S. Cl.
CPC ...... *G06F 12/0875* (2013.01); *G06F 12/0246* (2013.01); *G06F 12/0862* (2013.01);
(Continued)

(58) Field of Classification Search
CPC . G06F 9/30047; G06F 9/3806; G06F 12/0862
(Continued)

(56) References Cited

U.S. PATENT DOCUMENTS

| 5,696,927 A | 12/1997 | MacDonald et al. |
| 6,353,871 B1 | 3/2002 | Benveniste et al. |

(Continued)

OTHER PUBLICATIONS

Second Written Opinion for PCT/US2015/031717, mailed May 12, 2016, 5 pages.
(Continued)

*Primary Examiner* — Sean D Rossiter
(74) *Attorney, Agent, or Firm* — Withrow & Terranova, PLLC

(57) ABSTRACT

Memory controllers employing memory capacity and/or bandwidth compression with next read address prefetching, and related processor-based systems and methods are disclosed. In certain aspects, memory controllers are employed that can provide memory capacity compression. In certain aspects disclosed herein, a next read address prefetching scheme can be used by a memory controller to speculatively prefetch data from system memory at another address beyond the currently accessed address. Thus, when memory data is addressed in the compressed memory, if the next read address is stored in metadata associated with the memory block at the accessed address, the memory data at the next read address can be prefetched by the memory controller to be available in case a subsequent read operation issued by a central processing unit (CPU) has been prefetched by the memory controller.

28 Claims, 26 Drawing Sheets

Related U.S. Application Data filed on Dec. 16, 2014, provisional application No. 62/092,409, filed on Dec. 16, 2014.

(51) Int. Cl.

| | |
|---|---|
| *G06F 12/0875* | (2016.01) |
| *G06F 12/0862* | (2016.01) |
| *G06F 12/02* | (2006.01) |
| *G06F 12/1009* | (2016.01) |
| *H03M 7/30* | (2006.01) |

(52) U.S. Cl.
CPC .......... *G06F 12/1009* (2013.01); *H03M 7/30* (2013.01); *G06F 2212/1016* (2013.01); *G06F 2212/1056* (2013.01); *G06F 2212/251* (2013.01); *G06F 2212/401* (2013.01); *G06F 2212/45* (2013.01); *G06F 2212/602* (2013.01)

(58) Field of Classification Search
USPC ........................................................ 711/137
See application file for complete search history.

(56) References Cited

U.S. PATENT DOCUMENTS

| | | | |
|---|---|---|---|
| 6,523,102 B1 | 2/2003 | Dye et al. | |
| 6,640,283 B2 | 10/2003 | Naffziger et al. | |
| 6,735,673 B2 | 5/2004 | Kever | |
| 6,795,897 B2 | 9/2004 | Benveniste et al. | |
| 6,981,119 B1 | 12/2005 | Lepak et al. | |
| 7,512,750 B2 | 3/2009 | Newburn et al. | |
| 7,636,813 B2 | 12/2009 | Tremaine | |
| RE43,483 E | 6/2012 | Geiger et al. | |
| 8,341,380 B2 | 12/2012 | Deming et al. | |
| 8,539,163 B1 | 9/2013 | Sivasubramanian et al. | |
| 8,595,437 B1 | 11/2013 | Glasco et al. | |
| 8,751,830 B2 | 6/2014 | Muff et al. | |
| 2002/0040413 A1 | 4/2002 | Okada et al. | |
| 2003/0188110 A1 | 10/2003 | Abali et al. | |
| 2008/0059728 A1 | 3/2008 | Daly et al. | |
| 2008/0301256 A1 | 12/2008 | McWilliams et al. | |
| 2011/0055456 A1* | 3/2011 | Yeh .................... | G06F 12/0862 711/103 |
| 2012/0317334 A1 | 12/2012 | Suzuki et al. | |
| 2012/0317365 A1* | 12/2012 | Elhamias ............ | G06F 12/0862 711/141 |
| 2013/0138867 A1* | 5/2013 | Craft ................... | G06F 12/0246 711/103 |
| 2013/0179752 A1 | 7/2013 | Shim et al. | |
| 2014/0092678 A1 | 4/2014 | Feekes | |
| 2015/0339228 A1 | 11/2015 | Heddes et al. | |
| 2015/0339237 A1* | 11/2015 | Heddes ............... | G06F 12/0875 711/137 |
| 2015/0339239 A1 | 11/2015 | Heddes et al. | |
| 2015/0347013 A1* | 12/2015 | Mathur ............... | G06F 12/0862 711/103 |
| 2016/0055088 A1* | 2/2016 | Zhang ................ | G06F 12/0862 711/137 |
| 2016/0170904 A1* | 6/2016 | Guo .................... | G06F 12/0842 711/207 |
| 2016/0253266 A1* | 9/2016 | Park .................... | G06F 12/0238 711/154 |
| 2017/0103023 A1* | 4/2017 | Matsuo ............... | G06F 12/0862 |

OTHER PUBLICATIONS

International Preliminary Report on Patentability for PCT/US2015/031913, mailed May 30, 2016, 22 pages.
International Preliminary Report on Patentability for PCT/US2015/031885, mailed May 30, 2016, 22 pages.
International Search Report and Written Opinion for PCT/US2015/031717, mailed Aug. 12, 2015, 11 pages.
International Search Report and Written Opinion for PCT/US2015/031913, mailed Aug. 24, 2015, 9 pages.
International Search Report and Written Opinion for PCT/US2015/031885, mailed Aug. 24, 2015, 9 pages.
Author Unknown, "Understanding Memory Resource Management in VMware ESX 4.1," Vmware, Inc., 2010, retrieved from http://www.vmware.com/files/pdf/techpaper/vsp_41_perf_memory_mgmt.pdf, 25 pages.
Pekhimenko, G. et al., "Linearly Compressed Pages: A Low-Complexity,Low-Latency Main Memory Compression Framework," Proceedings of the 46th Annual IEEE/ACM International Symposium on Microarchitecture (MICRO-46), Dec. 7-11, 2013, Davis, CA, ACM, 13 pages.
International Preliminary Report on Patentability for PCT/US2015/031717, mailed Aug. 18, 2016, 23 pages.

* cited by examiner

| PATTERN | LENGTH | DEFINITION (272) |
|---|---|---|
| PATTERN0 | 32 | COVERS BIT 63..32 OF A 64-BIT WORD |
| PATTERN1 | 16 | COVERS BIT 31..16 OF A 64-BIT WORD |
| PATTERN2 | 16 | COVERS BIT 15..0 OF A 64-BIT WORD |

| FLAGS | VALUE | DEFINITION (280) |
|---|---|---|
| BIT 0, 1 | 00 | PATTERN0 = 0, NOT CODED IN VARIABLE LENGTH BASE BLOCK |
| | 01 | PATTERN0 = 0x000000yy, PATTERN0 IS CODED AS 8-BIT VALUE IN BASE BLOCK |
| | 10 | PATTERN0 IS CODED AS 32-BIT VALUE IN BASE BLOCK |
| | 11 | PATTERN1 IS CODED AS 16-BIT VALUE IN BASE BLOCK |
| BIT 2 | 1 | PATTERN1 IS CODED AS 16-BIT VALUE IN BASE BLOCK |
| BIT 3 | 1 | PATTERN2 IS CODED AS 16-BIT VALUE IN BASE BLOCK |

FIG. 20

MEMORY CONTROLLERS EMPLOYING MEMORY CAPACITY AND/OR BANDWIDTH COMPRESSION WITH NEXT READ ADDRESS PREFETCHING, AND RELATED PROCESSOR-BASED SYSTEMS AND METHODS

PRIORITY APPLICATIONS

The present application claims priority to U.S. Provisional Patent Application Ser. No. 62/001,545 filed on May 21, 2014 and entitled "MEMORY CONTROLLERS EMPLOYING MEMORY CAPACITY AND/OR BANDWIDTH COMPRESSION, AND RELATED PROCESSOR-BASED SYSTEMS AND METHODS," which is incorporated herein by reference in its entirety.

The present application also claims priority to U.S. Provisional Patent Application Ser. No. 62/092,326 filed on Dec. 16, 2014 and entitled "MEMORY CONTROLLERS EMPLOYING MEMORY CAPACITY AND/OR BANDWIDTH COMPRESSION, AND RELATED PROCESSOR-BASED SYSTEMS AND METHODS," which is incorporated herein by reference in its entirety.

The present application also claims priority to U.S. Provisional Patent Application Ser. No. 62/092,409 filed on Dec. 16, 2014 and entitled "MEMORY CONTROLLERS EMPLOYING MEMORY CAPACITY AND/OR BANDWIDTH COMPRESSION WITH NEXT READ ADDRESS PREFETCHING, AND RELATED PROCESSOR-BASED SYSTEMS AND METHODS," which is incorporated herein by reference in its entirety.

BACKGROUND

I. Field of the Disclosure

The technology of the disclosure relates generally to computer memory systems, and particularly to memory controllers in computer memory systems for providing central processing units (CPUs) with a memory access interface to memory.

II. Background

Microprocessors perform computational tasks in a wide variety of applications. A typical microprocessor application includes one or more central processing units (CPUs) that execute software instructions. The software instructions instruct a CPU to fetch data from a location in memory, perform one or more CPU operations using the fetched data, and generate a result. The result may then be stored in memory. As examples, this memory can be a cache local to the CPU, a shared local cache among CPUs in a CPU block, a shared cache among multiple CPU blocks, or main memory of the microprocessor.

In this regard, FIG. 1 is a schematic diagram of an exemplary system-on-a-chip (SOC) 10 that includes CPU-based system 12. The CPU-based system 12 includes a plurality of CPU blocks 14(1)-14(N) in this example, wherein 'N' is equal to any number of CPU blocks 14 desired. Each CPU block 14(1)-14(N) contains two CPUs 16(1), 16(2) and a shared level 2 (L2) cache 18(1)-18(N), respectively. A shared level 3 (L3) cache 20 is also provided for storing cached data that is used by any of, or shared among, each of the CPU blocks 14(1)-14(N). An internal system bus 22 is provided that allows each of the CPU blocks 14(1)-14(N) to access the shared L3 cache 20 as well as other shared resources. Other shared resources that can be accessed by the CPU blocks 14(1)-14(N) through the internal system bus 22 can include a memory controller 24 for accessing a main, external memory (e.g., double-rate dynamic random access memory (DRAM) (DDR)), peripherals 26, other storage 28, an express peripheral component interconnect (PCI) (PCI-e) interface 30, a direct memory access (DMA) controller 32, and an IMC 34.

As CPU-based applications executing in the CPU-based system 12 in FIG. 1 increase in complexity and performance, the memory capacity requirements of the shared L2 cache 18 and the shared L3 cache 20, and external memory accessible through the memory controller 24 may also increase. However, providing additional memory capacity in a CPU-based system increases costs and area needed on for memory on an integrated circuit. For example, if a CPU-based system, such as the CPU-based system 12 in FIG. 1, where provided in a SOC, adding additional memory capacity may increase the SOC packaging. Data compression may be employed to increase the effective memory capacity of a CPU-based system without increasing physical memory capacity. However, data compression can reduce CPU memory access times and thus decrease CPU performance, because data is stored in compressed form and must then be uncompressed during memory accesses.

Thus, it would be desirable to increase memory capacity of a CPU-based system while mitigating an increase in physical memory size as complexity and performance requirements of CPU-based applications increase, while also minimizing the impact on CPU performance.

SUMMARY OF THE DISCLOSURE

Aspects disclosed in the detailed description include memory controllers employing memory capacity and/or bandwidth compression with next read address prefetching, and related processor-based systems and methods. In certain aspects, memory controllers are employed that can provide memory capacity compression. In certain aspects disclosed herein, a next read address prefetching scheme may be combined with a memory bandwidth compression scheme and/or a memory capacity compression scheme. The next read address prefetching scheme can be used by a memory controller to speculatively prefetch data from system memory at another address beyond the currently accessed address. The next read address to be prefetched from system or main memory can be stored as metadata in association with compressed memory data stored in compressed memory, since there may be left over space in a memory block that holds compressed memory data in the compressed memory. Thus, when memory data is addressed in the compressed memory, if the next read address is stored in metadata associated with the memory block at the accessed address, the memory data at the next read address can be prefetched by the memory controller to be available in case a subsequent read operation issued by a central processing unit (CPU) has been prefetched by the memory controller. Used in conjunction with a memory bandwidth and/or memory capacity compression scheme, additional performance can be achieved while using left over space in memory blocks in the compressed memory.

In this regard, in one aspect, a memory controller is provided. The memory controller comprises a memory interface configured to access a system memory, and a controller. The controller is configured to receive a first memory read request comprising a first physical address (PA) to be read in the system memory over a system bus. The controller is also configured to access the first PA in the system memory to perform the received first memory read request. The controller is further configured to receive a next memory read request comprising a next PA to be read in the system memory over the system bus. The controller is also configured to access the system memory based on the next PA to perform the received first memory read request. The controller is further configured to store the next PA in the system memory in association with the first PA.

In another aspect, a memory controller is provided. The memory controller comprises a means for receiving a first memory read request comprising a first PA to be read in a system memory over a system bus. The memory controller also comprises a means for accessing the first PA in the system memory to perform the received first memory read request. The memory controller also comprises a means for receiving a next memory read request comprising a next PA to be read in the system memory over the system bus. The memory controller also comprises a means for accessing the system memory based on the next PA in the system memory to perform the received next memory read request. The memory controller also comprises a means for storing the next PA in the system memory in association with the first PA.

In another aspect, a method of compressing data for a memory read request to a system memory in a central processing unit (CPU)-based system is provided. The method comprises receiving a first memory read request comprising a first PA to be read in a system memory over a system bus. The method also comprises accessing the the first PA in the system memory to perform the first memory read request. The method also comprises receiving a next memory read request comprising a next PA to be read in the system memory over the system bus. The method also comprises accessing the next PA in the system memory to perform the received next memory read request. The method also comprises storing the next PA in the system memory associated with the first PA.

In another aspect, a CPU system is provided. The CPU system comprises a system bus. The CPU system also comprises at least one CPU core communicatively coupled to the system bus. The CPU system also comprises a memory controller communicatively coupled to the system bus. The CPU system also comprises a system memory communicatively coupled to the system bus, the system memory configured to store memory data. The CPU system also comprises a prefetch metadata data (PMD) cache comprising a plurality of cache entries each comprising an address entry and a corresponding next read address, the PMD cache communicatively coupled to the memory controller. The memory controller comprises a controller. The controller is configured to receive a first memory read request comprising a first PA to be read in the system memory over the system bus. The controller is also configured to access the first PA in the system memory to perform the received first memory read request. The controller is also configured to receive a next memory read request comprising a next PA to be read in the system memory over the system bus. The controller is also configured to access the system memory based on the next PA to perform the received next memory read request. The controller is also configured to store the next PA in the system memory in association with the first PA.

In other aspects, compression methods and formats that may be well-suited for small data block compression are disclosed. These compression methods and formats can be employed for memory capacity and/or memory bandwidth compression aspects disclosed herein.

With some or all of these memory controllers and compression schemes, it may be possible to increase memory capacity of a CPU-based system while mitigating an increase in physical memory size while also reducing bandwidth and power consumption, as complexity and performance requirements of CPU-based applications increase.

BRIEF DESCRIPTION OF THE FIGURES

FIGS. 15-21 illustrate exemplary data block compression formats and schemes, any of which may be used by the compressed memory controller to compress memory data blocks and decompress, compressed memory data blocks;

DETAILED DESCRIPTION

Figure 1:
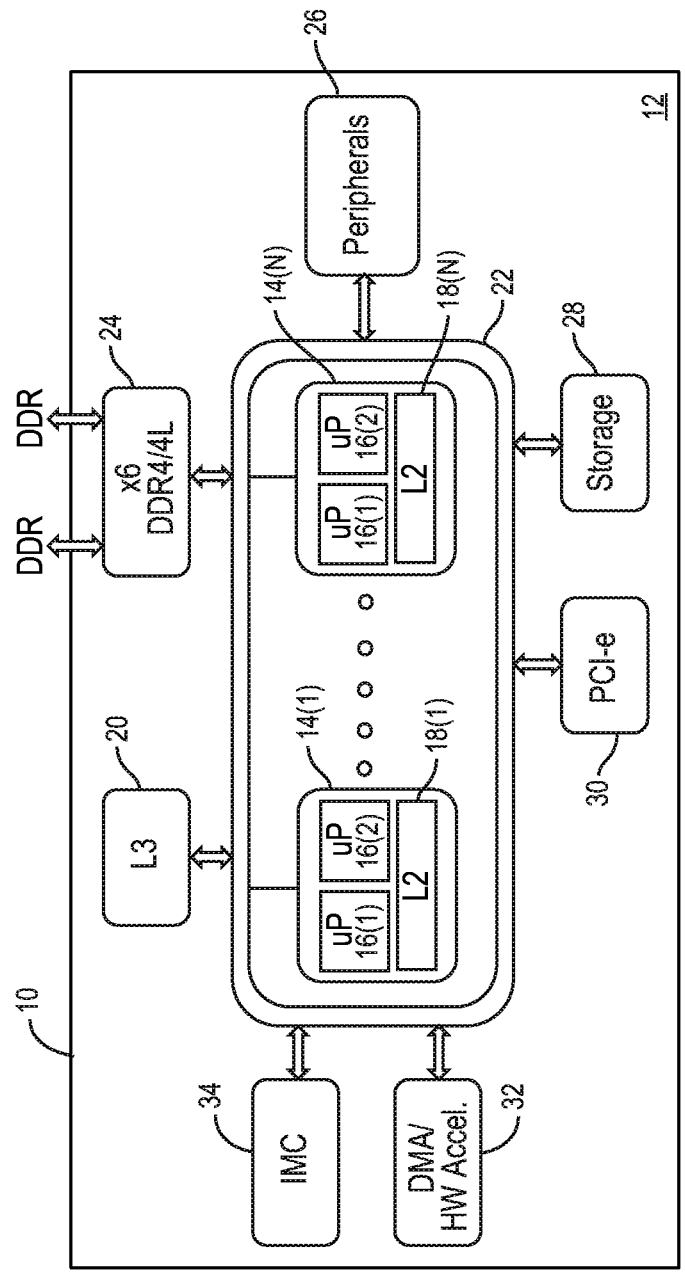
FIG. 1 is a schematic diagram of an exemplary system-on-a-chip (SOC) that includes central processing unit (CPU)-based system.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include memory controllers employing memory capacity and/or bandwidth compression with next read address prefetching, and related processor-based systems and methods. In certain aspects, memory controllers are employed that can provide memory capacity compression. In certain aspects disclosed herein, a next read address prefetching scheme may be combined with a memory bandwidth compression scheme and/or a memory capacity compression scheme. The next read address prefetching scheme can be used by a memory controller to speculatively prefetch data from system memory at another address beyond the currently accessed address. The next read address to be prefetched from system or main memory can be stored as metadata in association with compressed memory data stored in compressed memory, since there may be left over space in a memory block that holds compressed memory data in the compressed memory. Thus, when memory data is addressed in the compressed memory, if the next read address is stored in metadata associated with the memory block at the accessed address, the memory data at the next read address can be prefetched by the memory controller to be available in case a subsequent read operation issued by a central processing unit (CPU) has been prefetched by the memory controller. Used in conjunction with a memory bandwidth and/or memory capacity compression scheme, additional performance can be achieved while using left over space in memory blocks in the compressed memory.

Before discussing the examples of next read address prefetching, an exemplary CPU-based system and memory compression schemes that can employ the next read address prefetching are discussed below with regard to FIGS. 2-21. Examples of next read address prefetching start at FIG. 22A below.

Figure 2:
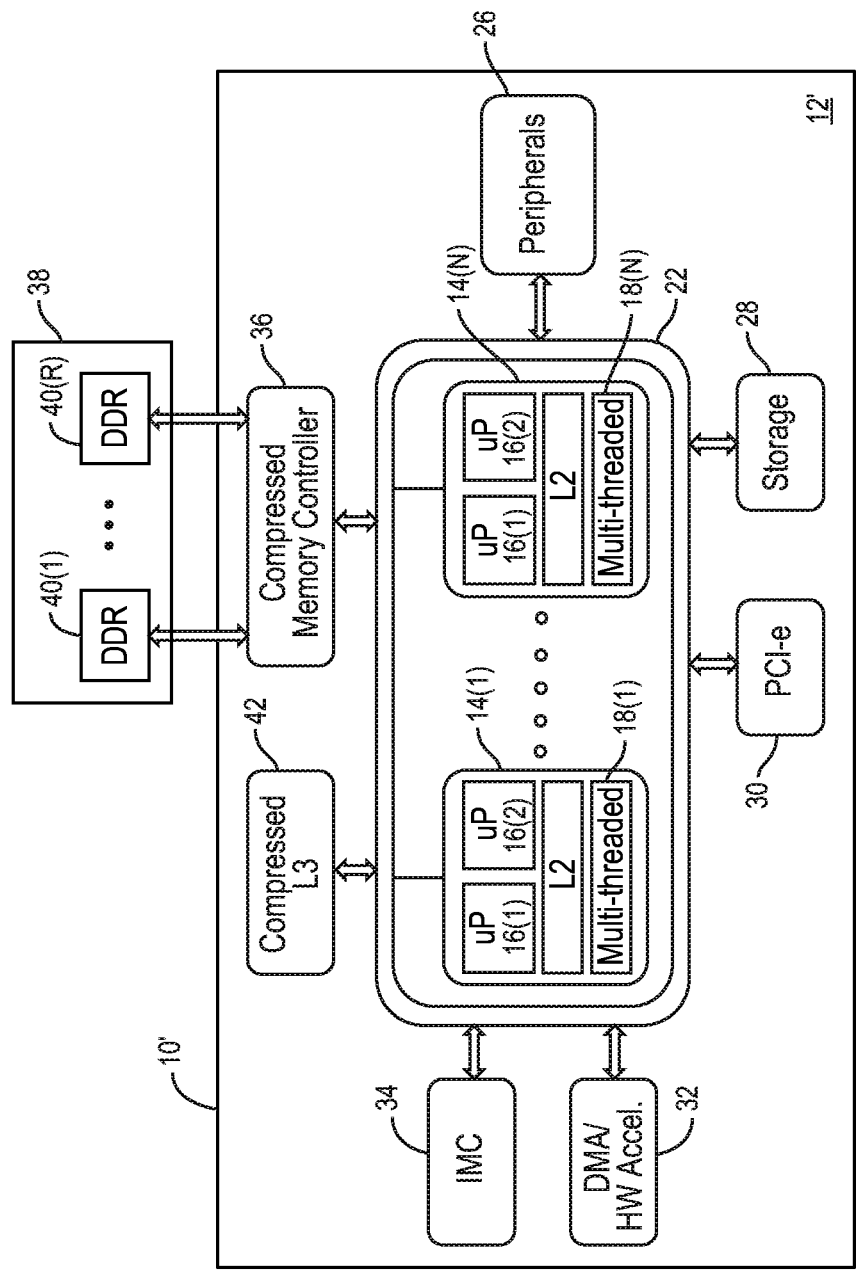
FIG. 2 is a schematic diagram of a SOC that includes an exemplary CPU-based system having a plurality of CPUs and a memory controller employing memory capacity and/or memory bandwidth compression.

In this regard, FIG. 2 is a schematic diagram of a SOC 10' that includes an exemplary CPU-based system 12' having a plurality of CPU blocks 14(1)-14(N) similar to the CPU-based system 12 in FIG. 1. The CPU-based system 12' in FIG. 2 includes some common components with the CPU-based system 12 in FIG. 1, which are noted by common element numbers between FIGS. 1 and 2, and thus will not be re-described. However, in the CPU-based system 12' in FIG. 2, a compressed memory controller 36 is provided. The compressed memory controller 36 controls access to a system memory 38. The system memory 38 may comprise one or more double data rate (DDR) dynamic random access memories (DRAMs) 40(1)-40(R) (hereinafter DRAM 40(1)-40(R)), as a non-limiting example. The compressed memory controller 36 in this example employs memory capacity and/or memory bandwidth compression according to the aspects disclosed herein and below. As will be discussed in more detail in the exemplary aspects below, the compressed memory controller 36 allows the CPU-based system 12' to have an effective increase in memory capacity without having to increase the physical memory size over the CPU-based system 12 in FIG. 1, but also in a manner that minimizes the impact on, or does not impact, CPU performance. Similar to the memory controller 24 of the CPU-based system 12 in FIG. 1, the compressed memory controller 36 in the CPU-based system 12' in FIG. 2 is shared by the CPU blocks 14(1)-14(N) through the internal system bus 22.

Further, with regard to FIG. 2, the CPUs 16(1) and 16(2) in each CPU block 14(1)-14(N) may include single hardware threads or multiple hardware threads. If multiple hardware threads are provided in each of the CPUs 16(1) and 16(2), latency of the CPUs 16(1) and 16(2) may be increased as a result. Thus, it may be desired to provide an increased memory capacity of a shared cache memory to the CPU blocks 14(1)-14(N) in the CPU-based system 12' to store thread information for the multiple threads in each CPU 16(1) and 16(2) of the CPU blocks 14(1)-14(N). In this regard, as will be discussed in more detail below, the CPU-based system 12' may also include a compressed cache 42 which is a shared cache memory to all the CPU blocks 14(1)-14(N). In this example, the compressed cache 42 is an L3 cache. By providing the compressed cache 42, the memory capacity of a shared cache can be increased without, for example, having to increase the physical memory size over the shared L3 cache 20 in the CPU-based system 12 in FIG. 1.

Thus in summary, by providing the compressed memory controller 36 and/or the compressed cache 42 in the CPU-based system 12' in FIG. 2, the memory capacity of the CPU-based system 12' can be increased without having to increase or minimally increase the physical memory size over the CPU-based system 12 in FIG. 1, but also in a manner that minimizes the impact on, or does not impact, CPU performance. The remainder of this disclosure will discuss exemplary aspects and features of the compressed memory controller 36 and/or the compressed cache 42 in the CPU-based system 12' in FIG. 2.

Figure 3:
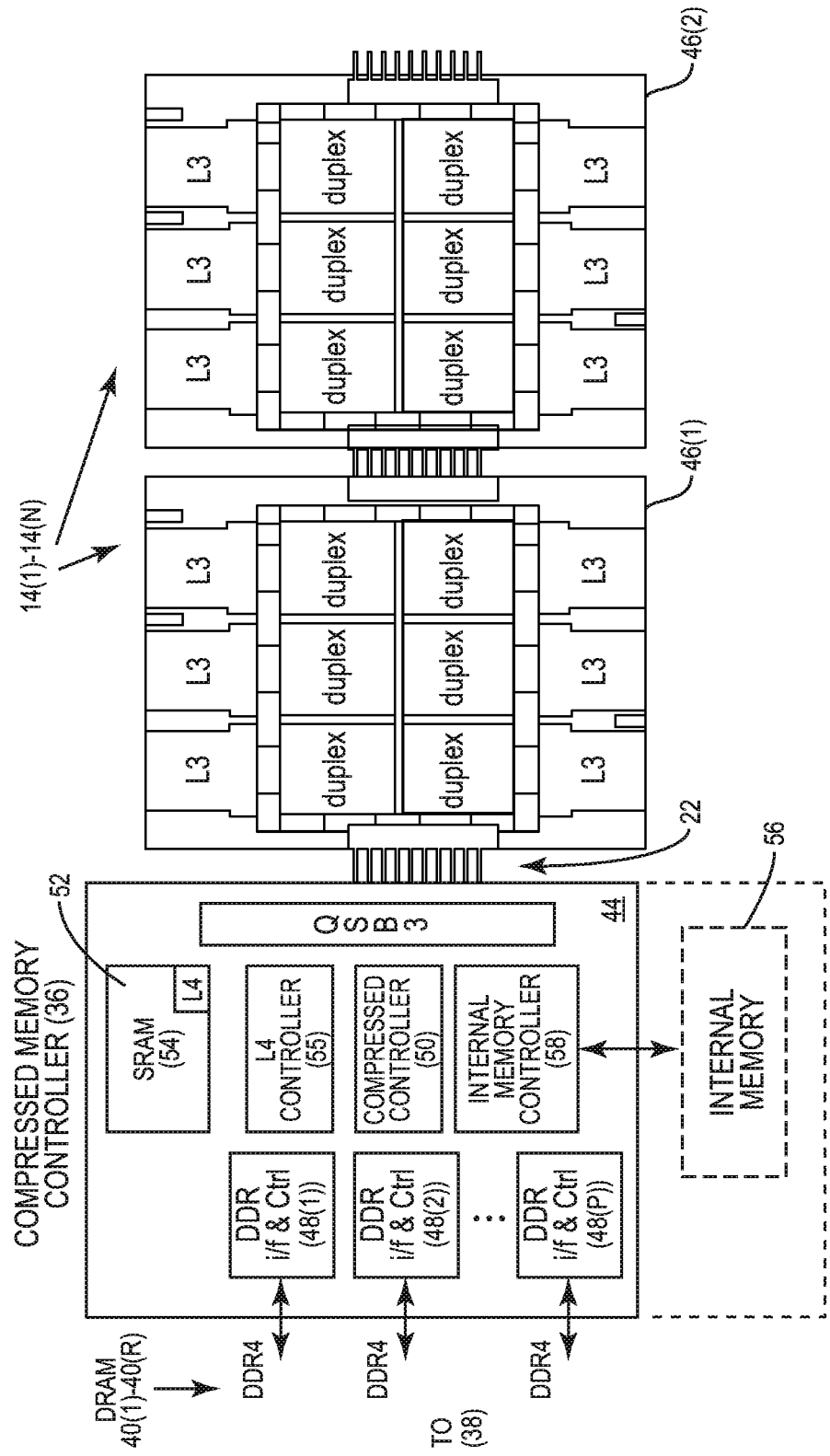
FIG. 3 is a more detailed schematic diagram of the memory controller in FIG. 2, wherein the compressed memory controller is further communicatively coupled to an optional, internal memory used to provide memory capacity and/or memory bandwidth compression.

In this regard, FIG. 3 illustrates a more detailed schematic diagram of exemplary internal components of the compressed memory controller 36 in FIG. 2. In this example, the compressed memory controller 36 is provided on a separate semiconductor die 44 from semiconductor dies 46(1), 46(2) that contain the CPU blocks 14(1)-14(N) in FIG. 2. Alternatively, the compressed memory controller 36 may be included in a common semiconductor die with the CPU blocks 14(1)-14(N). Regardless of the die configurations, the compressed memory controller 36 is provided such that the CPU blocks 14(1)-14(N) may make memory access requests via the internal system bus 22 to the compressed memory controller 36, and receive data from memory through the compressed memory controller 36.

With continuing reference to FIG. 3, the compressed memory controller 36 controls operations for memory accesses to the system memory 38, which is shown in FIGS. 2 and 3 as DRAM 40(1)-40(R). The compressed memory controller 36 includes a plurality of DRAM interfaces 48(1)-48(P) (e.g., DDR interfaces) used to service memory access requests. In this regard, the compressed memory controller 36 in this example includes a compressed controller 50. The compressed controller 50 controls compressing data stored to the system memory 38 and decompressing data retrieved from the system memory 38 in response to memory access requests from the CPU blocks 14(1)-14(N) in FIG. 2. In this manner, the CPU blocks 14(1)-14(N) can be provided with a virtual memory address space greater than the actual capacity of memory accessed by the compressed memory controller 36. The compressed controller 50 can also be configured to perform bandwidth compression of information provided over the internal system bus 22 to the CPU blocks 14(1)-14(N).

As will be discussed in more detail below, the compressed controller 50 can perform any number of compression techniques and algorithms to provide memory capacity and/or bandwidth compression. Local memory 52 is provided for data structures and other information needed by the compressed controller 50 to perform such compression techniques and algorithms. In this regard, the local memory 52 provided in the form of a static random access memory (SRAM) 54 in this example, is also provided in the compressed memory controller 36 to store data structures and other information needed by the compressed controller 50 to perform compression techniques and algorithms. The local memory 52 is of sufficient size to be used for data structures and other data storage that may be needed for the compressed controller 50 to perform compression techniques and algorithms. The local memory 52 may also be partitioned to contain a cache, such as an L4 cache (L4), to provide additional cache memory for internal use within the compressed memory controller 36. Thus, an L4 controller 55 may also be provided in the compressed memory controller 36 to provide access to the L4 cache (L4). Enhanced compression techniques and algorithms may require a larger internal memory, as will be discussed in more detail below. For example, the local memory 52 may be 128 kiloBytes (kB).

Further, as shown in FIG. 3 and as will be described in more detail below, an optional additional internal memory 56 can also be provided for the compressed memory controller 36. The additional internal memory 56 may be provided as a DRAM as an example. As will be discussed in more detail below, the additional internal memory 56 can facilitate additional or greater amounts of storage of data structures and other data than in the local memory 52 for the compressed memory controller 36 providing memory compression and decompression schemes to increase the memory capacity and/or memory bandwidth compression of the CPU-based system 12'. An internal memory controller 58 is provided in the compressed memory controller 36 to control memory accesses to the additional internal memory 56 for use in compression. The internal memory controller 58 is not accessible or viewable to the CPU blocks 14(1)-14(N).

Thus, in summary with regard to FIG. 3, providing the compressed memory controller 36 with access to the local memory 52 and the additional internal memory 56 for use in storing compression data structure information can provide memory capacity compression for increased memory capacity at a lower cost than providing additional physical memory. Avoiding increasing the physical memory of the CPU-based system 12' can save power consumption and reduce package footprint and cost as compared to providing additional physical memory. The memory capacity and/or bandwidth compression provided by the compressed memory controller 36 is transparent to the operating system controlling operations of the CPU blocks 14(1)-14(N).

Further, the compressed memory controller 36 in FIG. 3 can also perform memory bandwidth compression and zero line compression. The local memory 52 can be used to store larger data structures used for such compression. For example, bandwidth compression may be achieved by the compressed memory controller 36 storing larger data structures if the data is not also compressed. For example, if 128 bytes are to be transferred, 64 bytes may be transferred in a bandwidth compression scheme to reduce memory bandwidth, but the other 64 bytes of the 128 byte block may remain unused, thus providing for an increased compressed data structure. However, if memory capacity compression is also employed, the remaining 64 bytes of the 128 byte block may be reused for another memory block. Increased memory bandwidth can reduce memory access latency and allow more CPUs 16(1), 16(2) or their respective threads to access the same number of memory channels without impacting latency or minimizing the impact to latency. Or, the number of memory channels could be reduced while achieving similar latency results compared to a greater number of memory channels if such compression was not performed by the compressed memory controller 36, thereby reducing system level power.

By providing the additional internal memory 56 for use by the compressed memory controller 36 in FIG. 3, even larger amounts of data structures and data used for performing compression by the compressed memory controller 36 can be made available to further reduce latency effects due to compression. Additional CPUs 16(1), 16(2) and/or hardware threads therein may be provided to the CPU-based system 12' in FIG. 3 with increased effective memory capacity through compression, and/or a reduction in memory channels. If more memory is needed for data structures and data used for performing compression by the compressed memory controller 36, the additional internal memory 56 can be provided as discussed above. However, because the additional internal memory 56 is external to the compressed memory controller 36, such as on a different semiconductor die for example, the memory access latency to the additional internal memory 56 may be greater than to the local memory 52, although an increased size of the additional internal memory 56 may allow for enhanced compression and/or a larger number of CPUs 16(1), 16(2) and/or hardware threads per CPU 16 to be accommodated.

Each of the resources provided for memory capacity and/or bandwidth compression in the compressed memory controller 36 in FIG. 3, including the local memory 52 and the additional internal memory 56, can be used individually or in conjunction with each other to achieve the desired balance among resources and area, power consumption, increased memory capacity through memory capacity compression, and increased performance through memory bandwidth compression. Memory capacity and memory bandwidth compression can be enabled or disabled, as desired. Further, the resources described above for use by the compressed memory controller 36 can be enabled or disabled to achieve the desired tradeoffs among memory capacity and/or bandwidth compression efficiency, power consumption, and performance. Exemplary memory capacity and/or bandwidth compression techniques using these resources available to the compressed memory controller 36 will now be discussed.

Before discussing memory controllers employing memory capacity and/or bandwidth compression with next read address prefetching, several examples of different types of memory compression schemes that can be employed by the compressed memory controller 36 in FIGS. 2 and 3 are first discussed with regard to FIGS. 4-21. The memory controllers employing memory capacity and/or bandwidth compression with next read address prefetching, and related processor-based systems and methods can be employed with these different memory compression schemes.

Figure 4:
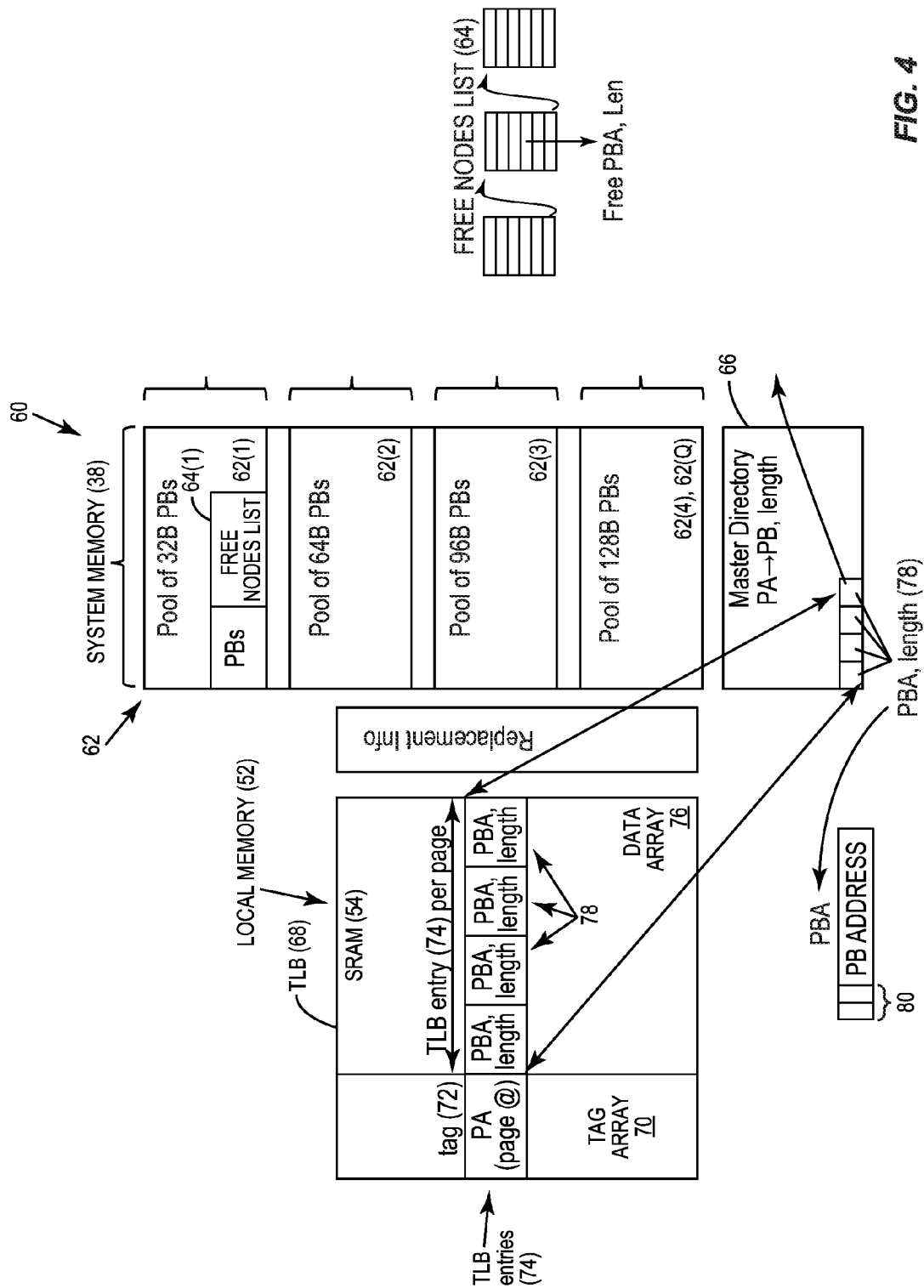
FIG. 4 is a schematic diagram of an exemplary line-based buffer memory capacity compression scheme that can be implemented by the compressed memory controller in FIG. 3.

In this regard, FIG. 4 is a schematic diagram of an exemplary line-based buffer memory capacity compression scheme 60 (hereinafter "line-based compression scheme 60") that can be implemented by the compressed memory controller 36 in FIG. 3. As will be discussed in more detail below, the line-based compression scheme 60 adds a new level of translation beyond a virtual address (VA) to physical address (PA) used in CPU operating systems, to provide more memory capacity than available physical memory in the CPU-based system 12' in FIG. 2. The physical address (PA) of an accessed memory location is additionally translated into a physical buffer address (PBA). The PBA contains an address (PB ADDRESS in FIG. 4) into a compressed memory (e.g., the system memory 38) accessible by the compressed memory controller 36, wherein compressed data for the PA provided by the CPU 16 to the compressed memory controller 36 resides. Thus, by providing this additional translation layer of a PBA in the compressed memory controller 36, the system memory 38 can effectively store more PAs than would normally be physically addressable in the system memory 38.

In this regard with reference to FIG. 4, in this line-based compression scheme 60, the compressed memory controller 36 stores and accesses compressed data to and from the system memory 38. In this example, the compressed memory controller 36 is configured to access 128 byte memory data blocks at a time (in uncompressed form) for each PA addressed in a memory access. This may be because the system memory 38 in the form of DRAM in this example is efficient when accessing 128 bytes at a time. Alternatively, the memory data blocks could be other byte lengths, such as 64 bytes for example. Turning back to the present example, the compressed memory controller 36 compresses the 128 byte memory data block in the system memory 38 to increase the effective memory capacity addressable with the compressed memory controller 36 beyond the size of the physical memory accessible by the compressed memory controller 36.

With continuing reference to FIG. 4, note that not every 128 byte memory data block can be compressed by the compressed memory controller 36 in the same compression byte size. Some memory data blocks may compress to smaller sizes than others depending on the nature of the data contained in the memory data block and the compression scheme employed. Thus, in this example, the system memory 38 is split into multiple bit-length pools 62(1)-62(Q) each addressable by a PBA. The pools 62(1)-62(Q) each store compressed data of 128-byte data blocks in compressed form in physical buffers (PBs). Each PB pool 62(1)-62(Q) is provided to store different sized compressed data so that memory data blocks that can be compressed to smaller sizes can be grouped together to avoid unused bit storage after compression. Although the PB pools 62(1)-62(Q) are shown grouped in contiguous PBs in FIG. 4, note that there is no requirement for the PB pools 62(1)-62(Q) to contain contiguous PBs. As will be discussed in more detail below, the size of each PB pool 62(1)-62(Q) can be dynamically assigned by the compressed memory controller 36.

In this example, PB pool 62(1) is used for storing compressed memory data blocks that can be stored in up to 32-bytes compressed. PB pool 62(2) is used for storing compressed memory data blocks that can be stored in up to 64-bytes compressed. PB pool 62(3) is used for storing compressed memory data blocks that can be stored in up to 96-bytes. PB pool 62(4) is used for storing compressed memory data blocks that can be stored in up to 128-bytes, which will include any memory data blocks that cannot be compressed below their native 128-byte length. Each PB pool 62(1)-62(Q) includes PBs that were compressed by the compressed memory controller 36 within the data compression size designated for the PB pool 62(1)-62(Q). As will be described in more detail below, each PB pool 62(1)-62(Q) also contains a respective free nodes list 64(1)-64(Q) (only 64(1) shown in FIG. 4) that contains a list of free PBAs in its respective PB pool 62(1)-62(Q) to be used by the compressed memory controller 36 to store future PBs at free PBAs during write transactions.

Note that the number of PB pools 62 ("Q") provided can vary depending on design and memory data block size. For example, if a memory data block size is 256 bytes, eight (8) PB pools 62 may be provided, each configured to store compressed memory data blocks in increments of 32 bytes (e.g., 32 bytes, 64 bytes, 96 bytes, . . . 256 bytes). Increasing the number of PB pools 62 for a given memory data block size may provide for increased memory compression ratios since the memory data block size is split into smaller byte sizes, but may also increase overhead in managing a greater number of PB pools 62. Further, increasing the memory data block size in a memory design may achieve an improved memory compression ratio, but may also decrease the size of each PB pool 62(1)-62(Q) or require more memory to provide each PB pool 62(1)-62(Q) to allow the desired PB pool 62(1)-62(Q) size.

On initialization of the line-based compression scheme 60 in FIG. 4, all PBs are contained in the free nodes list 64 meaning that no PBs have yet been allocated to a PA. During memory transaction operations, the compressed memory controller 36 accesses the system memory 38 to access the PBs for memory accesses based on the received PA from a CPU 16 (FIG. 2). The compressed memory controller 36 can decompress the PBs to provide the uncompressed data over the internal system bus 22 to the requesting CPU 16. Alternatively, the compressed memory controller 36 can provide the PB in uncompressed form over the internal system bus 22 to the requesting CPU 16 while performing memory bandwidth compression as well. Because the PBs in the system memory 38 are accessible by a PBA, the compressed memory controller 36 must perform a translation of the received PA for the memory access request to a PBA to access the correct PB corresponding to the PA in the memory access request. In this regard, a master directory 66 may be provided in the system memory 38 that stores PA to PBA translations. The compressed memory controller 36 uses the translated PA to perform a look-up in the master directory 66 to obtain the corresponding PBA as assigned to the PA when the PB was previously established and stored in a PB pool 62(1)-62(Q) during a write transaction based on the compression size of the PB. The PBA can be associated with any PB in an assigned PB pool 62(1)-62(Q) to give flexibility in storing compressed data in any PB as memory accesses occur, without adjacent PBs having to correspond to adjacent PB As. This allows greater compression rates to be achieved.

With continuing reference to FIG. 4, it may be desired to allow the compressed memory controller 36 to more quickly translate PAs to PBAs that have been recently translated without requiring the master directory 66 to be accessed. In this regard, in the example, the local memory 52 may be configured as an n-way associative cache in this example to provide a translation lookaside buffer (TLB) 68. In this regard, the TLB 68 in the local memory 52 is provided in the form of the SRAM 54 that can be organized like an n-way cache. The TLB 68 contains a tag array 70 with tags 72 of PAs as part of TLB entries 74 contained therein. A data array 76 is provided in the SRAM 54 that contains a plurality of TLB entries 74 each comprising data entries of PBAs and corresponding address lengths 78 from the master directory 66 for each tag 72. The width of the n-way associative TLB 68 provided in the SRAM 54 is provided to facilitate the desired amount of PBAs stored in each TLB entry 74 as well as the desired address length 78 of the PBA. The address length 78 of the PBAs determines to what granularity (e.g., page, byte, etc.) the PBs are accessed in the PB pools 62(1)-62(Q).

In this regard, with continuing reference to FIG. 4, when the compressed memory controller 36 performs a memory access, the compressed memory controller 36 uses the translated PA to perform a look-up in the tag array 70 of the SRAM 54. If a TLB entry 74 in the tag array 70 has a tag 72 that matches the translated PA, a TLB hit occurs in the TLB 68. Thus, the corresponding PBA to the PA contained in the master directory 66 is contained in the data array 76 in the TLB entry 74 corresponding to the tag 72. In this scenario, the compressed memory controller 36 does not need to access the master directory 66 to translate the PA into PBAs, thus reducing the latency involved since accessing the master directory 66 in the system memory 38 may be greater than accesses to the SRAM 54. The compressed memory controller 36 can use the PBA and corresponding address length 78 in the matching TLB entry 74 to know which PB to address in the system memory 38 and how many bytes to read that were assigned to the PB to store the full compressed memory data. If the transaction is a read transaction, the compressed line is read from the system memory 38 at the PBA location. If the transaction is a write transaction, the compressed data is stored at the PBA in the PB of the system memory 38.

If a TLB miss occurs in the TLB 68 in FIG. 4, the compressed memory controller 36 uses the PA to perform a look-up in the master directory 66. A TLB entry 74 is evicted from the TLB 68 according to the replacement policy. The PBA in the master directory 66 corresponding to the PA is placed into the TLB 68. The PB starting position and address length 78 obtained from the master directory 66 for the PA is used by the compressed memory controller 36 to access the compressed data in the PB. If the transaction is a read transaction, the compressed line is read from the system memory 38 at the PBA location.

If the transaction is a write transaction, the compressed data is stored at the PBA in the PB of the system memory 38. If the length of the PB at the PBA is the same as the compression size of the compressed line, the compressed line can be written into the same PBs at the PBA location in the system memory 38. If the length of a PB at the PBA is different than the compression size of the compressed line, the compressed memory controller 36 will find a free PB in the free nodes list 64 in another PB pool 62(1)-62(Q) based on the system memory 38 that will accommodate the compressed line to be stored in the system memory 38. The operation of the free nodes list 64 will be discussed in more detail below in FIG. 7. If there is not an available PB in the free nodes list 64 for the PB pool 62(1)-62(Q) of the desired PB size in the system memory 38, the compressed memory controller 36 reads an entire page from a PB pool 62 at the PBA, replenishes the corresponding free nodes list 64 with the entire page from the PB pool 62, and updates the PBA and PBA length for the PA corresponding to a write address for a write operation in the TLB 68, and writes back the compacted PB at the PBA in the system memory 38. If there are still not enough PBs available in the free nodes list 64 for the PB pool 62(1)-62(Q) after compaction, the compressed memory controller 36 can retrieve a larger PB from another free nodes list 64 of another PB pool 62(1)-62(Q) containing larger PBs, and return the original PB to the free nodes list 64 for the original PB pool 62(1)-62(Q). If the compressed size is such that a smaller sized PB can be used, a smaller sized PB can also be obtained from a free nodes list 64 of another PB pool 62(1)-62(Q) containing smaller sized PBs. Again, the original PB is returned to the free nodes list 64 for the original PB pool 62(1)-62(Q).

The TLB entry 74 size in the SRAM 54 could be any size desired, such as 64 bytes, 128 bytes, or 256 bytes, as examples. In this example, the TLB entry 74 contains four (4) PBAs from the master directory 66, because the compressed memory controller 36 is configured to load four (4) PBAs from the system memory 38 to the SRAM 54 at a time, as shown in FIG. 4. Two (2) bits of encoding 80 are provided in each PBA, as shown in FIG. 4, to indicate to which PB pool 62(1)-62(4), the PBA corresponds. The compressed memory controller 36 then uses the PBA corresponding to the PA to access the correct PB at the location of the PBA in the corresponding PB pool 62(1)-62(4).

In this example of FIG. 4, a special case can be provided for memory data for a PA that is all 0's (i.e., a zero line). In this case, the compressed memory controller 36 can encode a PBA as PBA address 0 for the PA in the SRAM 54 as a special case, meaning that no PB has been assigned. The compressed memory controller 36 recognizes a 0 PB address in the PBA as the memory data corresponding to the PA being all 0's. Thus, memory data that is all 0's is compressed to an effective 0 bytes, because a PB at PB address 0 is not required to be used for the compressed memory controller 36. Thus, the PB pools 62(1)-62(Q) never need to be accessed for memory data that is all 0's. Power consumption is also reduced as a result of not having to access the system memory 38 for a zero line compression case.

If available PBs in a particular PB pool 62(1)-62(Q) become depleted, the compressed memory controller 36 can be configured to assign a PA to other PBAs in another PB pool 62(1)-62(Q). This functionality may be provided as part of a background task by the compressed memory controller 36. Depletion means that the available PBs in a particular PB pool 62(1)-62(Q) drops below a threshold, because it may be desired to assign a PA to other PBAs in another PB pool 62(1)-62(Q) before there are no remaining PBs available in a given PB pool 62(1)-62(Q). If a given PB pool 62(1)-62(Q) becomes depleted, other PBs in other PB pools 62(1)-62(Q) can be made available. For example, if memory data can be compressed to 32-bytes or lower by the compressed memory controller 36, and there are no more available PBs in the 32 byte PB pool 62(1) as an example, the compressed memory controller 36 can reassign a PB in the 64 byte PB pool 62(2) into two (2) 32 byte PBs for the PB pool 62(1) in a PB split operation. However, if there are no more available PBs in the 128 byte PB pool 62(4) as an example, the compressed memory controller 36 can reassign two (2) PBs in the 64 byte PB pool 62(3) to form one 128 byte PB for the PB pool 62(4) in a merge PB operation. However, the two 64 byte PBs in the 64 byte PB pool 62(3) must be contiguous to be reassigned to the 128 byte PB pool 62(4) in a merge PB operation in this example.

One feature of the line-based compression scheme 60 is that larger PB addresses provided in PBAs are stored in the SRAM 54, because the PBs are accessed on a per-line basis in the PB pools 62(1)-62(Q) (as opposed to a per-page basis for example). Thus, the size of the TLB 68 provided by the SRAM 54 may be large as a result, because a larger number of bits are stored in each PBA in each TLB entry 74. It may be desired to have a smaller TLB 68 for providing PA to PBA address translation in memory capacity compression performed by the compressed memory controller 36.

In this regard with reference to FIG. 5, a page-based buffer memory capacity compression scheme 82 (hereinafter "page-based compression scheme 82") may be performed by the compressed memory controller 36 in FIG. 3 to store and access compressed data. The page-based compression scheme 82 is similar to the line-based compression scheme 60 in FIG. 4, and can use the same resources provided in the CPU-based system 12' in FIG. 2. Thus, the page-based compression scheme 82 discussed herein will make reference to FIGS. 2 and 3. As will be discussed in more detail below, providing a page-based compression scheme 82 allows a smaller TLB 68 size to be provided in the SRAM 54 in FIG. 3 than the line-based compression scheme 60 in FIG. 4, because addresses stored in the SRAM 54 act as a TLB 68 address of entire memory pages instead of buffer lines. Thus, the sizes of the addresses stored in the SRAM 54 do not have to be full address lengths. However, in the page-based compression scheme 82, pools of data pages (DP) of a memory page size (e.g., 1 kB, 2 kB, 3 kB, 4 kB) are allocated in the system memory 38 (FIG. 3) instead of, for example, allocated pools of line-sized PBs of lower byte sizes of 32, 64, 96, and 128 bytes in the example of FIG. 4. Also, similar to the line-based compression scheme 60 in FIG. 4, the page-based compression scheme 82 maintains DP pools in the system memory 38.

Figure 5:
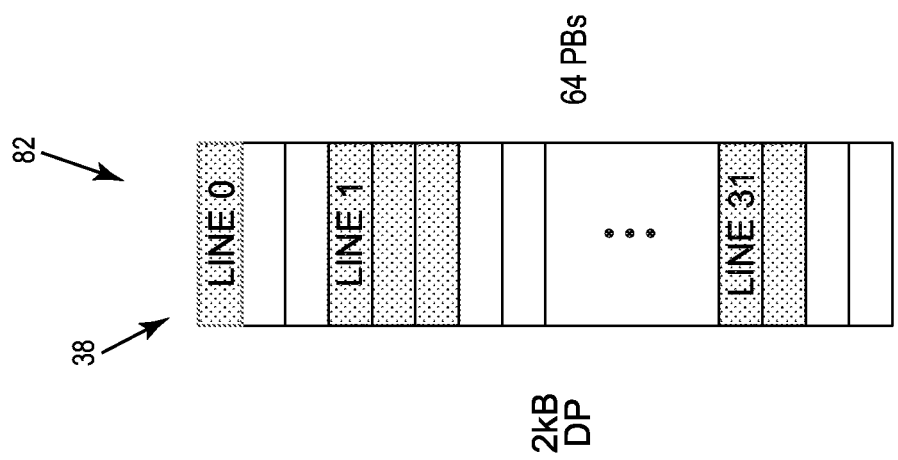
FIG. 5 is a schematic diagram of an exemplary data page (DP) stored in compressed memory accessible by the compressed memory controller in FIG. 3 to provide a page-based buffer memory capacity compression scheme.

With reference to FIG. 5, the system memory 38 is shown that contains a single DP for the page-based compression scheme 82. In this example, the DP is 2 kB in size. The DP in the system memory 38 is divided into sixty-four (64) physical buffers (PB) of equal size, which is 32 bytes in this example. A physical buffer (PB) is similar to a PB in the line-based compression scheme 60 above, except that compressed data may span consecutive PBs within a DP. Line 0 only occupies one 32 byte PB in the exemplary DP in FIG. 5. Line 1 occupies three (3) consecutive 32 byte PBs in the exemplary DP in FIG. 5. Line 31 occupies two (2) consecutive 32 byte PBs. Lines spanning more than one PB are always stored in contiguous PBs in a DP. The DPs and PBs contained therein are addressable by data page addresses (DPAs) that can be translated from PAs by the compressed memory controller 36. Similar to the master directory 66 in FIG. 4, a portion of the system memory 38 that stores the DPs would be used for a master directory to translate PAs to DPAs for accessed compressed DPs stored in the system memory 38.

Figure 6:
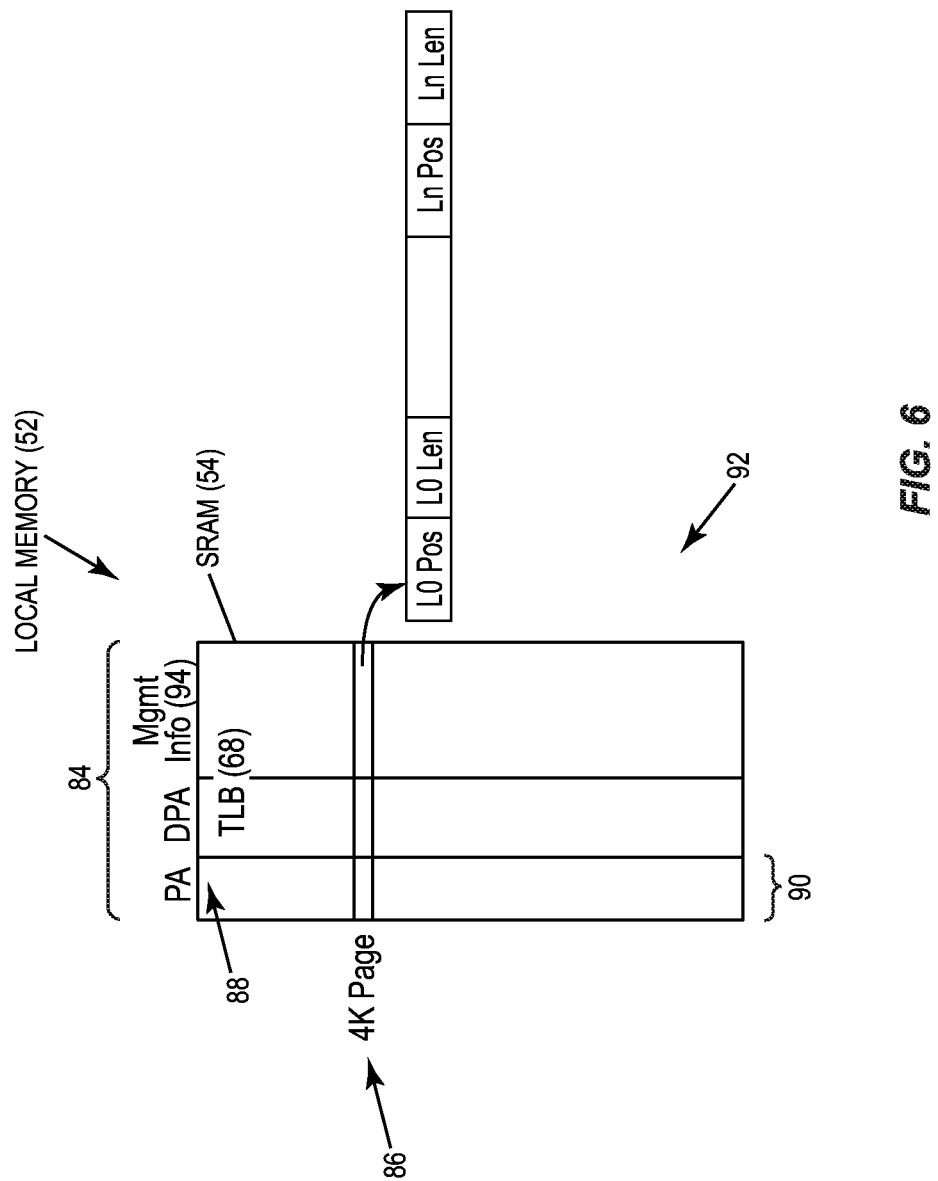
FIG. 6 is a schematic diagram of an exemplary translation lookaside buffer (TLB) configured to correlate physical addresses (PAs) to data page addresses (DPAs) to compressed data pages stored in compressed memory, and accessible by the compressed memory controller in FIG. 3 to provide a page-based buffer memory capacity compression scheme.

FIG. 6 illustrates a TLB 84 that can be provided in the SRAM 54 to translate PAs to data page addresses (DPA) more quickly for recently translated PAs. The TLB 84 is organized like a cache. Each cache line 86 in the TLB 84 represents a DP in the system memory 38. PAs are contained in tags 88 in a tag array 90 in each valid cache line 86. DPAs are stored in the cache line 86 in a data array 92 in the TLB 84 that correspond to the PAs. The DPA can be stored in fewer bits than the full address bit size of a PB, because the DPA needs to address a page in the system memory 38. As shown in FIG. 6, management information 94 is provided for each DPA that contains a plurality of line positions (e.g., L0 Pos, L1 Pos, . . . Ln Pos) and corresponding line lengths (e.g., L0 Len, L1 Len, . . . Ln Len) that correspond to PBs in the memory page corresponding to the DP at the DPA, as shown in FIG. 5. The line position indicates the start of a line in the DP, and the line length indicates the number of PBs comprised in the line in the DP. Upon a TLB miss in the TLB 84, the TLB 84 is loaded with the cache line 86 associated with a DPA, which is smaller than the TLB entry 74 in the line-based compression scheme 60 in FIG. 4.

Figure 7:
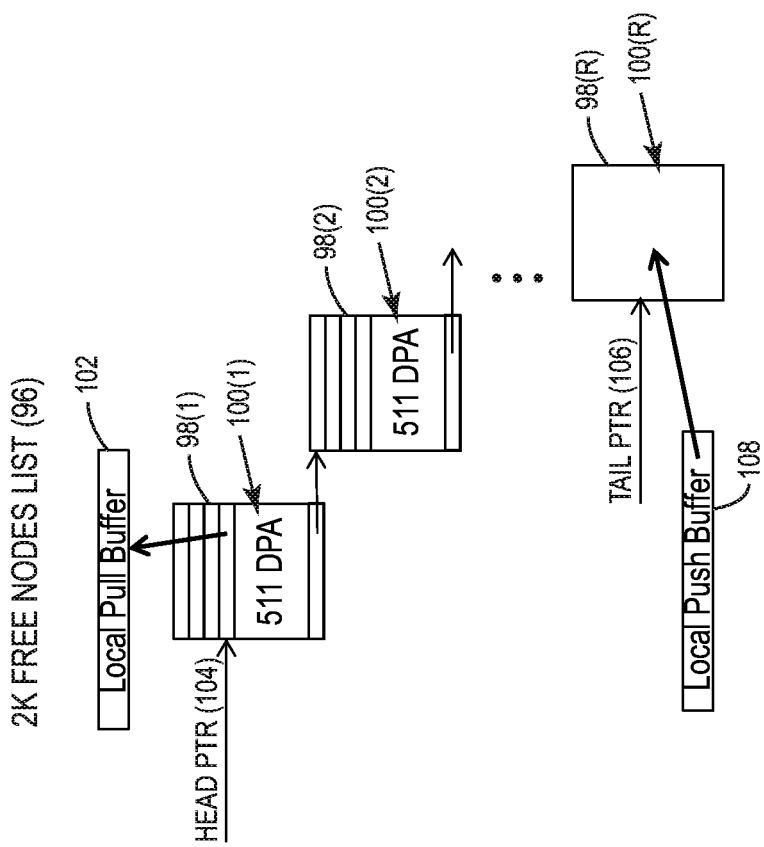
FIG. 7 is a schematic diagram of an exemplary free list buffer that can be employed in a page-based or line-based buffer memory capacity compression scheme, including in FIGS. 4-6.

The page-based compression scheme 82 in FIGS. 5 and 6 also employs a free nodes list to allocate free DPs in the system memory 38 to use for compressing memory pages, similar to the free nodes list 64 in the line-based compression scheme 60 in FIG. 4. An exemplary free nodes list 96 that can be used to allocate free DPs in the system memory 38 to use for compressing memory pages in the page-based compression scheme 82 is shown in FIG. 7. As illustrated therein, the free nodes list 96 is a linked list. The number of DPA free lists 98(1)-98(R) in the free nodes list 96 is provided to be sufficient to cover all DPAs for all DPs. Although the DPA free lists 98(1)-98(R) are shown as being segregated into DPAs with sizes equal to a DP, it is not necessary that contiguous DPAs be assigned to a given DP. Within each DPA free list 98(1)-98(R) is a list of free DPAs 100(1)-100(R). When new DPAs are needed to be assigned for storing compressed data in the PB of a DP, one or more free DPAs 100(1)-100(R) from the free nodes list 96 corresponding to the DP size, is pulled into a local pull buffer 102. A head pointer 104 is provided in the head free DPA 100(1) to traverse the free nodes list 96. A tail pointer 106 is provided to allow free-up of DPAs that are no longer assigned to a DB in a DP to be pushed from a local push buffer 108 into a tail of the free nodes list 96. A scheme similar to the page-based compression scheme 82 in FIG. 7 can also be used as the free nodes list 64 for the line-based compression scheme 60 in FIG. 4. The DPAs pulled from the free nodes list 96 for the page-based memory compression scheme 82 may be assigned a memory page at a time, whereas the DPAs pulled from the free nodes list 64 for the line-based compression scheme 60 in FIG. 4 may be assigned a buffer line at a time. Also, because the local pull buffer 102 and the local push buffer 108 of the next group of DPs are maintained, this allows the compressed memory controller 36 to read or write main pointers pointing to free DPs into the free nodes list 96 in a single burst from DRAM, for example, for efficiency purposes.

With either of the line-based compression scheme 60 in FIG. 4 or the page-based compression scheme 82 in FIGS. 5 and 6, another feature that can be provided therein is that the system memory 38 used to store DBs (for the line-based compression scheme 60) or DPs (for the page-based compression scheme 82) can be used to store the free nodes list 64 or 96 of DBAs (for the line-based compression scheme 60) or DPAs (for the page-based compression scheme 82). This conserves memory for storing the free node lists 64 or 96. With reference to the free nodes list 96 in FIG. 7, the head pointer 104 allows the compressed memory controller 36 to know the start of the DP free nodes stored within the DPs with the system memory 38. The tail pointer 106 allows the compressed memory controller 36 to know the end of the DP free nodes stored within the DPs with the system memory 38. A newly allocated DPA from the free nodes list 96 is added to the end of the free nodes list 96 in the system memory 38 such that the allocated DPA will not be reallocated when the compressed memory controller 36 requests a new DPA to be allocated. When a DPA pointer is freed up in the free nodes list 96, it is returned to the free nodes list 96. The free nodes list 64 in FIG. 4 can be similarly stored within the DBs of the system memory 38 in FIG. 4, and accessed by the compressed memory controller 36 therein.

Another method of DP management to create larger DPs if needed, when only smaller DPs are available in the system memory 38, is to keep pairs of DPs. For example, a 1 Kb DP could be paired with a 3 kB DP. A 2 kB DP could be paired with another 2 kB DP. Within the system memory 38, occupied DPs that are smaller than the maximum page size (e.g., 4 kB) could keep a back pointer to the corresponding PA. In a background task, once a threshold allocation of DPs is reached, the compressed memory controller 36 could scan the free nodes list 96 and look for free DPs 100 that also have a free DP pair. The free DP 100 and its pair could be combined to provide a larger DP in the system memory 38. If a second threshold is reached, then in the background task, the compressed memory controller 36 could scan the free nodes list 96 and look in the other DP of the corresponding DP pair to see if it is occupied with compressed data. If so, the compressed memory controller 36 could get the tail pointer 106 to the PA, move the occupied DP to another DP from the free nodes list 96 for the same DP size, merge the two (2) adjacent DPs into a larger DP, and update the free nodes list 96. The compressed memory controller 36 could then use the tail pointer 106 to the PA to update the master directory 66 and optionally, the TLB 68, to point to the new DPA for the occupied DP.

Figure 8:
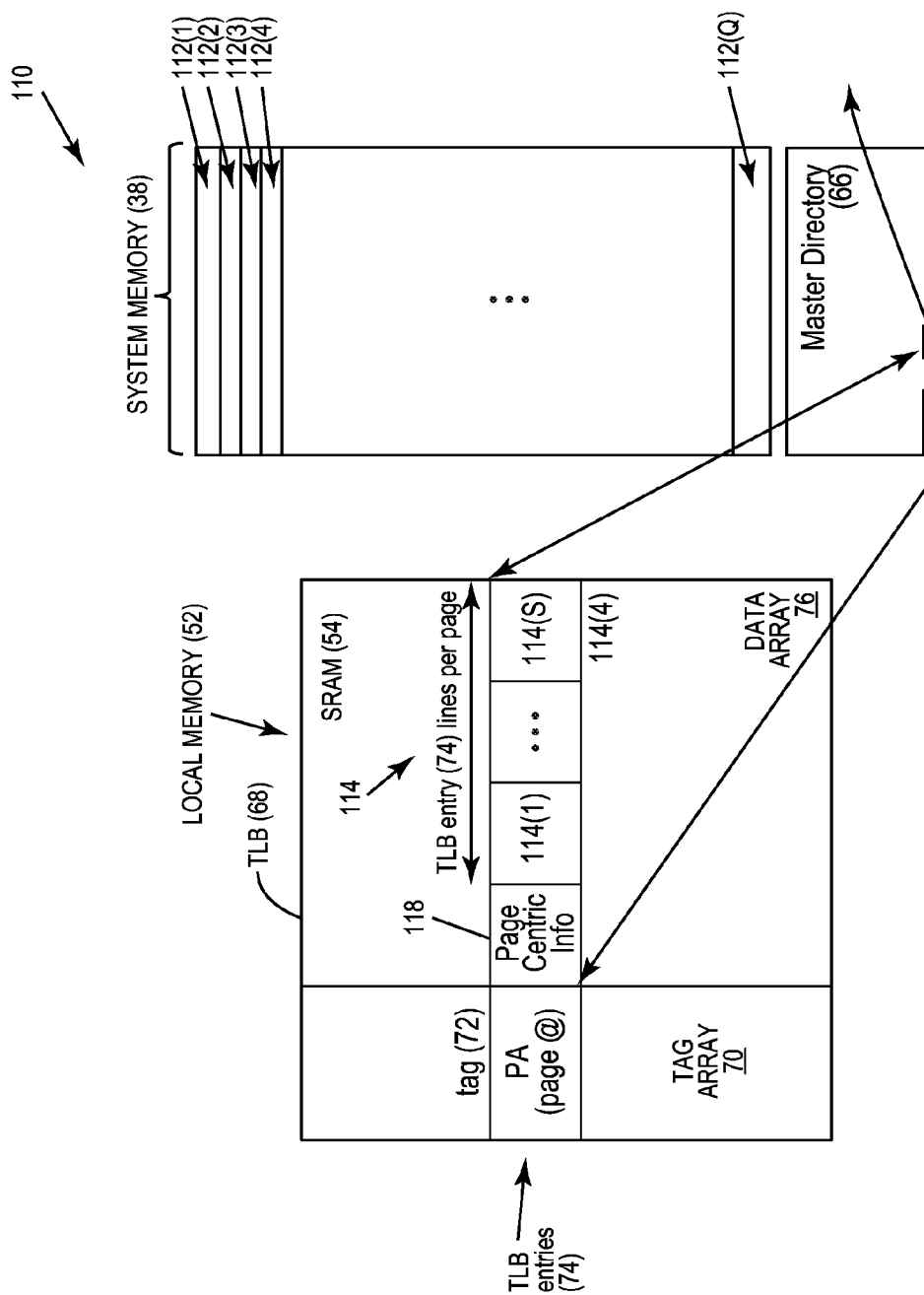
FIG. 8 is a schematic diagram of an exemplary hybrid line/page-based buffer memory capacity compression scheme that can be implemented by the compressed memory controller in FIG. 3.

It may be desired to provide a memory capacity compression scheme that includes characteristics of both the line-based compression scheme 60 described above in regard to FIG. 4 and the page-based compression scheme 82 described above with regard to FIGS. 5-7. In this regard, FIG. 8 is a schematic diagram of an exemplary hybrid line/page-based buffer memory capacity compression scheme 110 that can be implemented by the compressed memory controller 36 in FIG. 3. As will be discussed below, the hybrid line/page-based buffer memory capacity compression scheme 110 contains features of both a line-based buffer memory capacity compression scheme and a page-based buffer memory capacity compression scheme. The hybrid line/page-based buffer memory capacity compression scheme 110 contains common components with the line-based compression scheme 60 illustrated in FIG. 4, which are noted with common element numbers.

In this regard with reference to FIG. 8, in the hybrid line/page-based buffer memory capacity compression scheme 110, the compressed memory controller 36 is configured to access 128 byte memory data blocks at a time (in uncompressed form) for each PA addressed in a memory access. The system memory 38 is split into multiple physical blocks (PBs) 112(1)-112(Q) of the same size (e.g., 1 kB) that are each addressable by a buffer pointer 114 in a TLB entry 74 in the data array 76 of the TLB 68. Each PA is a page address (e.g., 4 kB) that maps to a plurality of buffer pointers 114(1)-114(S) each corresponding to a corresponding plurality of PBs 112(1)-112(Q) (e.g., 1 kB each) in the system memory 38. Thus, by splitting a PA page address into a number of PBs 112(1)-112(Q), each PB 112 can be of the same size to achieve the benefits similar to a line-based memory capacity compression scheme, but with data compression still managed by the compressed memory controller 36 on a data page size basis (e.g., 4 kB) like a page-based memory capacity compression scheme. Further, as will be discussed below, each of the memory data blocks within each PB 112 are the same size (e.g., 32 bytes).

Figure 9:
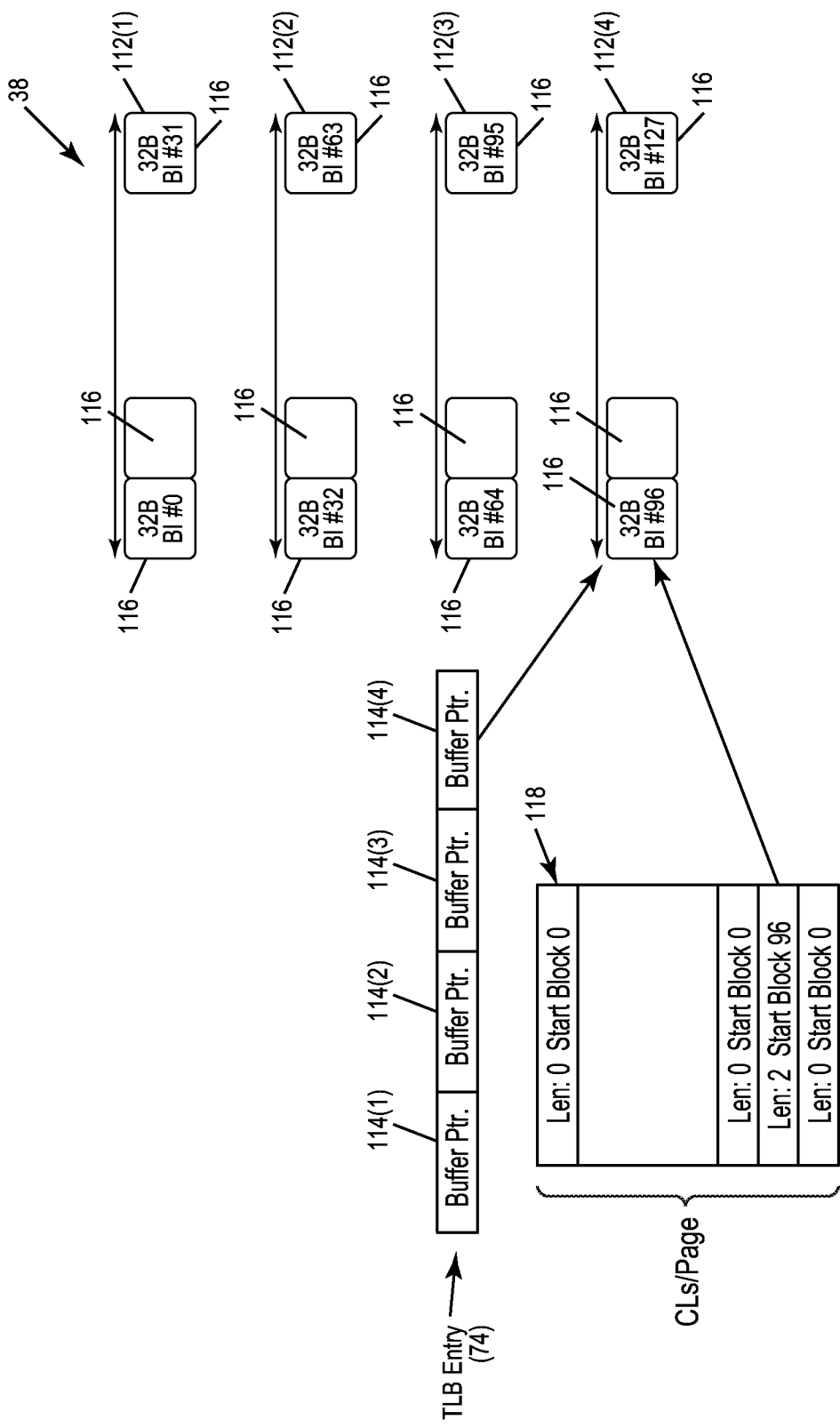
FIG. 9 is a schematic diagram of an exemplary data page (DP) comprised of a plurality of data buffers (DBs) each comprising a plurality of data memory blocks, stored in compressed memory accessible by the compressed memory controller in FIG. 3, for storing compressed cache lines provide a hybrid line/page-based buffer memory capacity compression scheme in FIG. 8.

FIG. 9 is a schematic diagram of an exemplary data page (DP) of 4 kB size comprised of a plurality of 1 kB PBs 112(1)-112(4) that are provided in the system memory 38 according to the hybrid line/page-based buffer memory compression scheme 110 in FIG. 8. As shown therein, each PB 112(1)-112(4) comprises a plurality of memory data blocks 116, which are each the same size (e.g., 32 bytes each in this example). Note that there is no requirement for the PBs 112(1)-112(4) corresponding to a given PA to be stored contiguously in the system memory 38. Because the data pages (DPs) are comprised of the same sized PBs 112(1)-112(4), the sizing of the PBs 112(1)-112(4) does not have to be dynamically assigned by the compressed memory controller 36.

In this example, each PB 112(1)-112(Q) is for storing compressed memory data blocks that can be stored in up to 32-bytes compressed. If the compressed memory data blocks cannot be compressed down to 32 bytes, contiguous memory data blocks 116 within a given PB 112 can be assigned for storing of the compressed data. Each TLB entry 74 in the TLB 68 is configured to contain a plurality of the buffer pointers 114(1)-114(S), which is up to four (4) buffer pointers 114(1)-114(4) in this example (e.g., if PA addresses page size of 4 kB, and the PBs 112(1)-112(4) are 1 kB each). The buffer pointers 114(1)-114(4) do not have to point to contiguous PBs 112(1)-112(4). The buffer pointers 114(1)-114(4) in a TLB entry 74 for a given PA are set by the compressed memory controller 36 to point to a particular PB 112(1)-112(4) when allocated, as needed. The TLB entries 74 are filled from the master directory 66 as previously explained. If a PB 112 has not been allocated, the corresponding buffer pointer 114 in the TLB entry 74 for the tag 72 will be null, or some other information will indicate that the PB 112 corresponding to the buffer pointer 114 has not yet been allocated by the compressed memory controller 36.

With continuing reference to FIG. 9, when a PA is received by the compressed memory controller 36, the PA is compared to the tags 72 in the TLB 68 to look up a TLB entry 74 corresponding to the PA. The compressed memory controller 36 uses the address of the PA to consult the TLB entry 74 for the corresponding DP and to determine the address of the PB 112(1)-112(4) corresponding to the PA within the corresponding PB. For example, as shown in FIG. 9, if the PA corresponds to the fourth buffer pointer 114(4) in the selected TLB entry 74 in the TLB 68, the buffer pointer 114(4) may point to PB 112(4) in the system memory 38. Page information 118 stored in each TLB entry 74 and corresponding to a page of compressed data is further accessed by the compressed memory controller 36 based on the PA. The page information 118 contains thirty-two (32) entries in this example, because there are thirty-two (32) TLB entries 74 per data page in this example. A cache line in the page information 118 is accessed based on the word to be accessed according to the PA to determine the starting memory data block 116 and length of the compressed memory data in the selected PB 112(4). In this example, the compressed memory data corresponding to the PA corresponds to starting memory data block 116 B1# '96' with a value of '2,' meaning a length of three (3) (to save bits), and meaning the compressed memory data is three (3) bytes starting in memory data block 116 B1#96.

Figure 10:
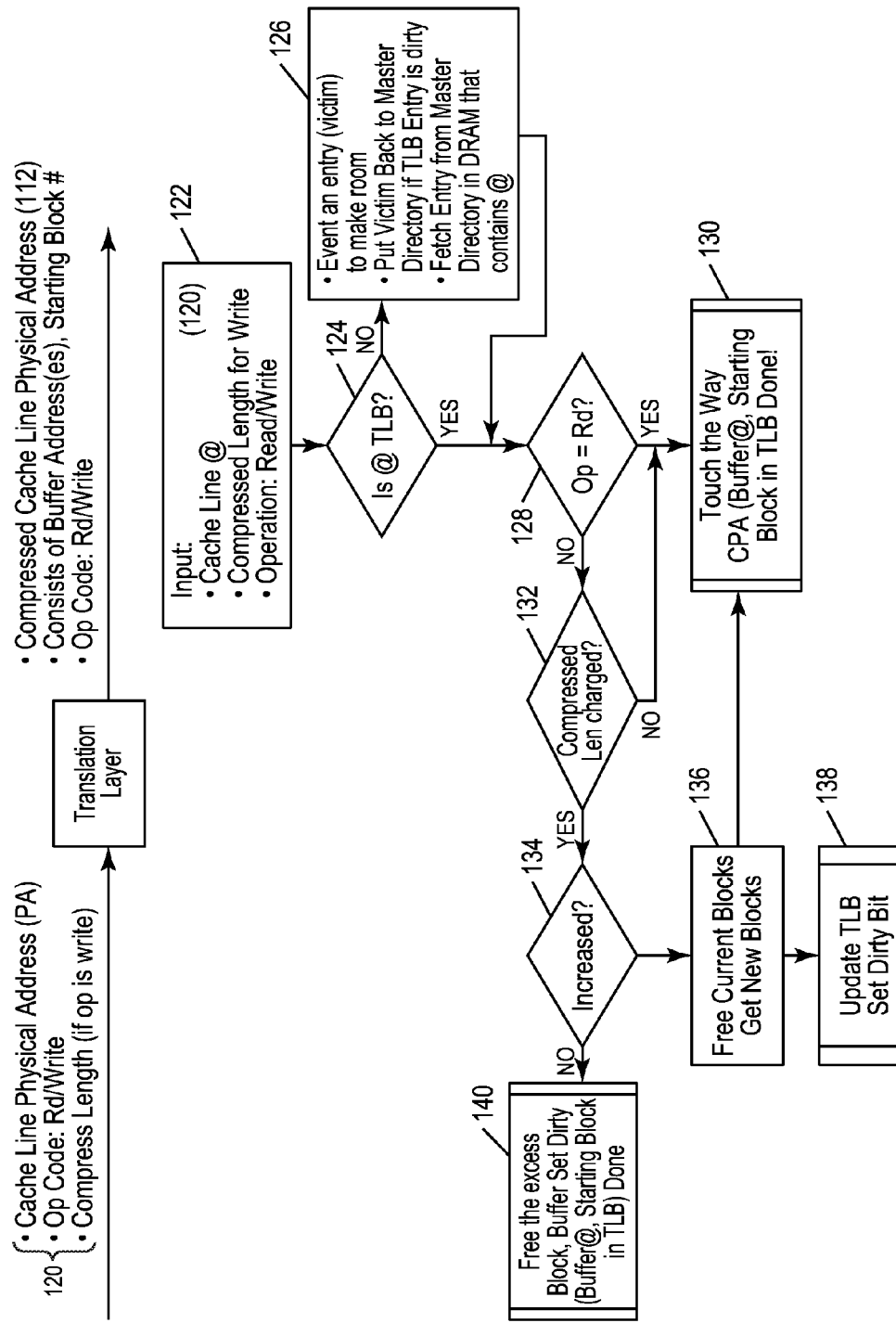
FIG. 10 is a flowchart illustrating an exemplary process of the compressed memory controller in FIG. 3 translating a PA to an allocated DB within an allocated data page (DP) in FIG. 9 according to the hybrid line/page-based buffer memory capacity compression scheme in FIG. 8 for a memory access.

FIG. 10 is a flowchart illustrating an exemplary process of the compressed memory controller 36 in FIG. 3 translating a PA to an allocated PB 112 within an allocated DP in FIG. 9 according to the hybrid line/page-based buffer memory capacity compression scheme 110 in FIG. 8 for a memory access. As illustrated therein, the compressed memory controller 36 receives a PA as input data 120 (block 122). The PA has an opcode as a read or write memory transaction (block 122). The input data 120 may also contain a compression length if the memory transaction is a write transaction (block 122). The compressed memory controller 36 consults the TLB 68 as illustrated in FIGS. 8 and 9 to convert the PA into a PB 112 with a starting block number and the opcode of a read or write transaction (block 124). If the PA is not contained in the TLB 68, the compressed memory controller 36 evicts an existing TLB entry 74 in the TLB 68 to make room for the newly received PA (block 126). The evicted TLB entry 74 is stored back in the master directory 66 if the TLB entry 74 is dirty (block 126). The TLB entry 74 in the master directory 66 corresponding to the received PA is fetched from the master directory 66 and placed into the TLB 68 (block 126).

With continuing reference to FIG. 10, if the PA is contained in the TLB 68 or the eviction process in block 126 has completed, the compressed memory controller 36 determines if the memory access is a read or write operation (block 128). If the memory access is a read operation, the compressed memory controller 36 uses the TLB entry 74 to access the memory data blocks 116 corresponding to the buffer pointer 114 and the page information 118 in the TLB 68 to read the compressed memory data and the process is complete (block 130). If the memory transaction is a write operation, the compressed memory controller 36 determines if the compressed length from the input data 120 has changed (block 132). If not, the compressed memory controller 36 uses the TLB entry 74 to access the memory data block(s) 116 corresponding to the buffer pointer 114 and page information 118 in the TLB 68 to write the compressed memory data and the process is complete (block 130). If the compressed memory controller 36 determines that the compressed length from the input data 120 has changed (block 132), and increased (block 134), the compressed memory controller 36 frees the current memory data block(s) 116 in the system memory 38 corresponding to the PA and allocates new memory data blocks 116 to the PA (block 136) and updates the TLB 68 and dirty bits for the corresponding TLB entry 74 (block 138). If the compressed memory controller 36 determines that the compressed length from the input data 120 has not increased (block 134), the compressed memory controller 36 frees the excess memory data block(s) 116 in the system memory 38 corresponding to the PA (block 140) (or alternatively free all memory data block(s) 116 and reallocate new memory data blocks 116 in the system memory 38), updates the length of the memory data block 116 in the page information 118 corresponding to the PA, and sets the dirty bits in the TLB entry 74 in the TLB 68 (block 140).

Figure 11A:
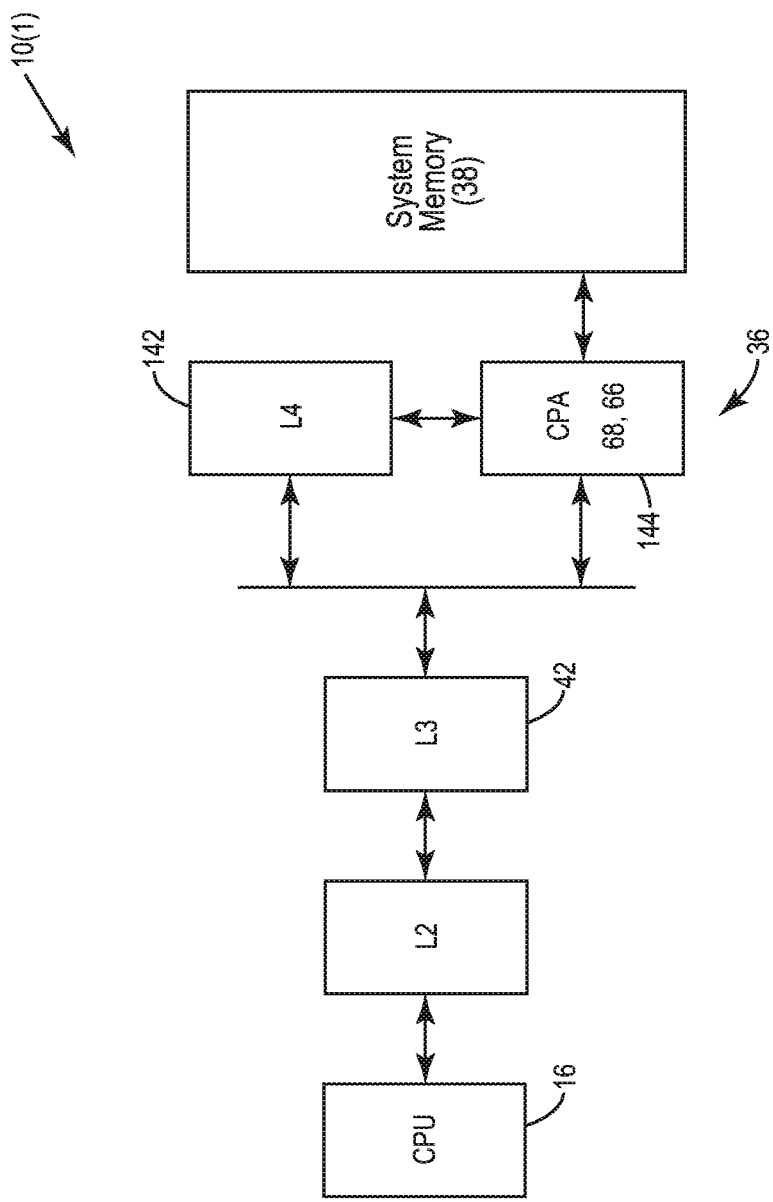
FIG. 11A illustrates an example of the SOC in FIG. 3 that additionally includes an optional L4 cache to compensate for performance loss due to address translation in the compressed memory controller.

It may also be desired to provide the SOC 10' in FIG. 2 with an additional cache that can compensate for any performance loss due to the operation of the compressed memory controller 36 to translate a received PA into a compressed PA present in the system memory 38. In this regard, FIG. 11A illustrates an example of an alternative SOC 10(1) like the SOC 10' in FIG. 2, but the SOC 10(1) in FIG. 11A additionally includes an optional repository, which is a cache 142 in this example. The cache 142 is an L4 cache in this example. The compressed memory controller 36 can look up a PA in both the L4 cache 142 and the TLB 68 or the master directory 66 (referred to herein as compressed PA (CPA) 144) concurrently to minimize latency. The addresses in the L4 cache 142 are PAs that are uncompressed. Upon a PA hit in the L4 cache 142, the PA lookup in the CPA 144 is redundant. Upon a PA miss in the L4 cache 142, a PA lookup in the CPA 144 is required to obtain the translated compressed PA.

Figure 11B:
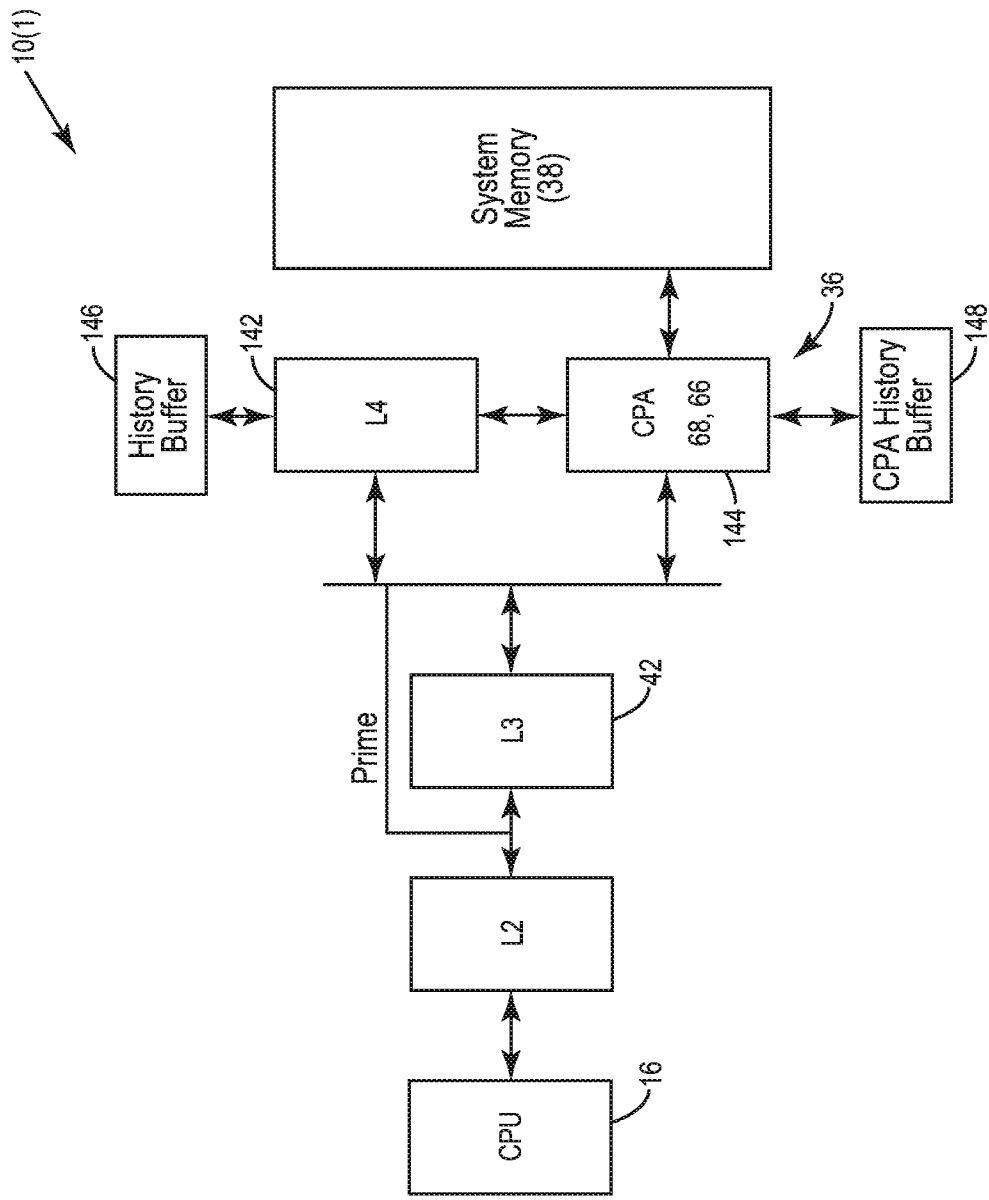
FIG. 11B illustrates an example of the SOC in FIG. 11A with priming of the L4 cache and a translation lookaside buffer (TLB) in the compressed memory controller to look up a PA before a hit or miss is determined in the L4 cache.

To avoid additional latency of the CPU 16 accessing both the L4 cache 142 and the CPA 144, the L4 cache 142 and CPA 144 may be primed. In this regard, FIG. 11B illustrates an example of the SOC 10(1) in FIG. 11A with priming of the L4 cache 142 and the CPA 144 in the compressed memory controller 36 to look up the PA before a hit or miss is determined in the shared L3 cache 42. When the shared L3 cache 42 is accessed by the CPU 16 for a read operation, the L4 cache 142 and CPA 144 can be primed by doing an early lookup of the PA therein. The results of these lookups can be stored in a history buffer 146 associated with the L4 cache 142 and a CPA history buffer 148 associated with the CPA 144. As an example, the history buffer 146 and/or the CPA history buffer 148 may be built from registers having a small latency. Upon a miss in the CPA 144, an optional pre-fetch may be performed by the compressed memory controller 36 in the master directory 66. This priming of the CPA 144 can provide an improved CPA 144 read hit rate. When a miss occurs in the shared L3 cache 42, the history buffer 146 is inspected to determine if a hit occurred in the L4 cache 142. If a hit occurred in the L4 cache 142, the data from the L4 cache 142 is returned. If a miss occurred in the L4 cache 142, the CPA history buffer 148 is then inspected. If a hit occurs in the CPA 144 based on inspection of the CPA history buffer 144, the compressed PA can be read directly from the CPA 144; otherwise (i.e., L4 cache 142 miss and CPA 144 miss), the master directory 66 is read by the compressed memory controller 36 to obtain the compressed PA for the read operation to be executed.

Due to the memory capacity compression that can be provided by the compressed memory controller 36 disclosed herein, more memory address space is made available to an operating system (OS) than the memory space physically present. For example, an OS may be given 16 Gb of memory space, but only 8 Gb of physical system memory 38 may be provided. As compression ratio changes (i.e., gets worse), all free DPs in the system memory 38 can diminish. It is desired to provide an ability for the compressed memory controller 36 to be able to reclaim memory from a guest OS. However, some basic operating principles or rules may need to be followed. For example, a first exemplary rule may be desired to provide that DPs cannot be taken away from the OS which have already been assigned to the OS. Also, another exemplary rule may be to provide that the view of pages by the OS is maintained as a full, non-translated address (e.g., a VA is a VA, a PA is a PA). In other words, the compression performed by the compressed memory controller 36 and underlying memory fragmentation that can result in the DPs in the system memory 38 is hidden from the OS and completely handled by the hardware of the compressed memory controller 36. Further, as another exemplary rule, a write by the OS must always succeed meaning that the full PA space of the OS must be writable even when the system memory 38 is less than the VA space.

In this regard, to allow the OS to comply with these rules, a compression driver could be installed into each OS executing on the CPUs 16 to allow for dynamic memory sizing. The compression driver is an extension to the OS and does not affect the memory management scheme of the OS. When the system memory 38 is running low on free compressed PBs, this increases the pressure on balloon drivers that request pages from the OS. These compression drivers request more memory from the OS. When the compression drivers obtain more memory, they pin it, meaning that the page cannot be swapped out to a disk, and thus, a VA to PA translation mapping must be maintained by the OS. The compression drivers then write highly compressible patterns to the memory. Thus, no hypervisor or translation support is required. The DP management schemes discussed above can be used to reallocate DPs to needed free DPs. An "emergency" balloon can be kept in order to absorb bursts.

Figure 12:
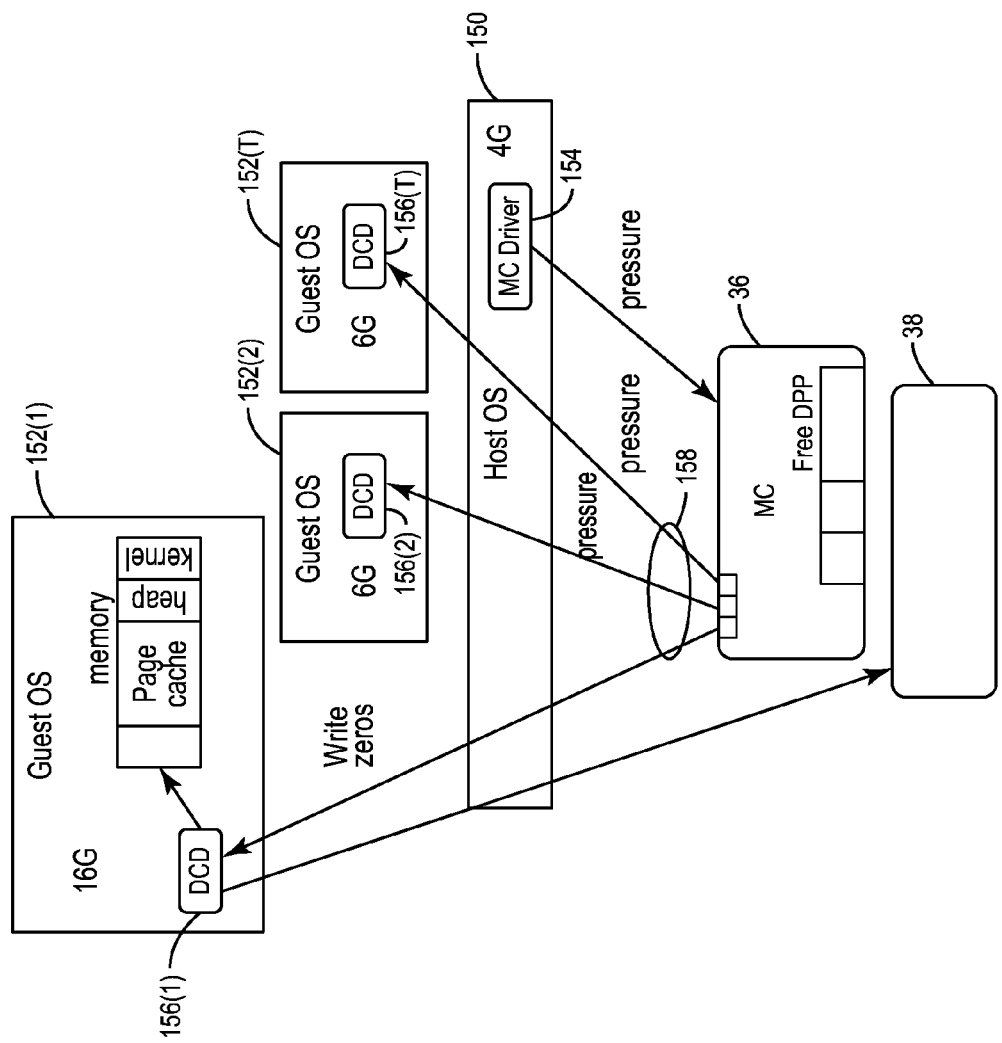
FIG. 12 is a schematic diagram of an exemplary dynamic memory sizing.

FIG. 12 is a schematic diagram of an exemplary dynamic memory sizing. For example, a host OS 150 is provided that can run on the CPU 16 in the SOC 10 in FIG. 1. The host OS 150 supports one or more guest OSs 152(1)-152(T). The host OS 150 provides an interface to the system memory 38 to the guest OSs 152(1)-152(T). In the example in FIG. 12, the system memory 38 may be 32 GB addressable that can be allocated to the host OS 150, but 16 GB in size using an expected 2× compression ratio. A memory controller driver 154 running in the host OS 150 as a hypervisor initializes the hardware by setting up the buffer pools, the guest OS 152(1)-152(T) attributes, quality of service (QOS) requirements, size of memory (PAs) allocated, and memory faults.

With continuing reference to FIG. 12, a data compression driver (DCD) 156(1)-156(T) is installed on each guest OS 152(1)-152(T). When the compressed memory controller 36 is running low on free compressed memory buffers in the system memory 38, the compressed memory controller 36 provides an indication to the guest OSs 152(1)-152(T) in the form of pressure data 158, which increases the pressure on the data compression drivers 156(1)-156(T). The compressed memory controller 36 monitors the free buffer state and provides the pressure data 158 to each guest OS 152 (1)-152(T). This could be a memory-mapped register assigned to each data compression driver 156(1)-156(T). As the compressed memory controller 36 detects that the free pool of buffers is depleting in the system memory 38, the compressed memory controller 36 can increase the pressure register value to each guest OS 152(1)-152(T) depending on attributes.

In response, the data compression drivers 156(1)-156(T) in the guest OSs 152(1)-152(T) request more memory from the host OS 150, which asserts pressure on the host OS 150 to free memory from other sources using the system memory 38. For example, the host OS 150 may use page caching and process heap to free memory. The data compression drivers 156(1)-156(T) may be configured to request pages from its respective guest OS 152(1)-152(T) at a level proportional to the pressure register value as an example. The guest OSs 152(1)-152(T) can provide pages and, if needed, free up pages from other pools, like the page cache. The guest OSs 152(1)-152(T) can also page-out used pages from the heap, etc.

When the data compression drivers 156(1)-156(T) obtain more memory from the system memory 38, they pin it and can then write highly compressible patterns to the system memory 38. In this regard, the data compression drivers 156(1)-156(T) can writes zeros (0's) to pages, and the compressed memory controller 36 can effectively free underlying buffers back to the free pool. Thus, no hypervisor or translation support is required. The DP management schemes discussed above can be used to reallocate DPs to needed free DPs. An "emergency" balloon can be kept in order to absorb bursts.

As discussed above, the compressed memory controller 36 can also employ memory bandwidth compression schemes. For example, it may be desired to compress a 128 byte data block on a memory bus, such as the internal system bus 22, to reduce bandwidth on the internal system bus 22. Reducing bandwidth can also reduce bus latency and reduce power consumption. The number of CPUs 16 and/or hardware threads provided in the CPUs 16 may be able to be increased as well without impacting CPU 16 performance. Or alternatively, the option to reduce the number of memory channels for a given bus bandwidth could be provided.

Figure 13:
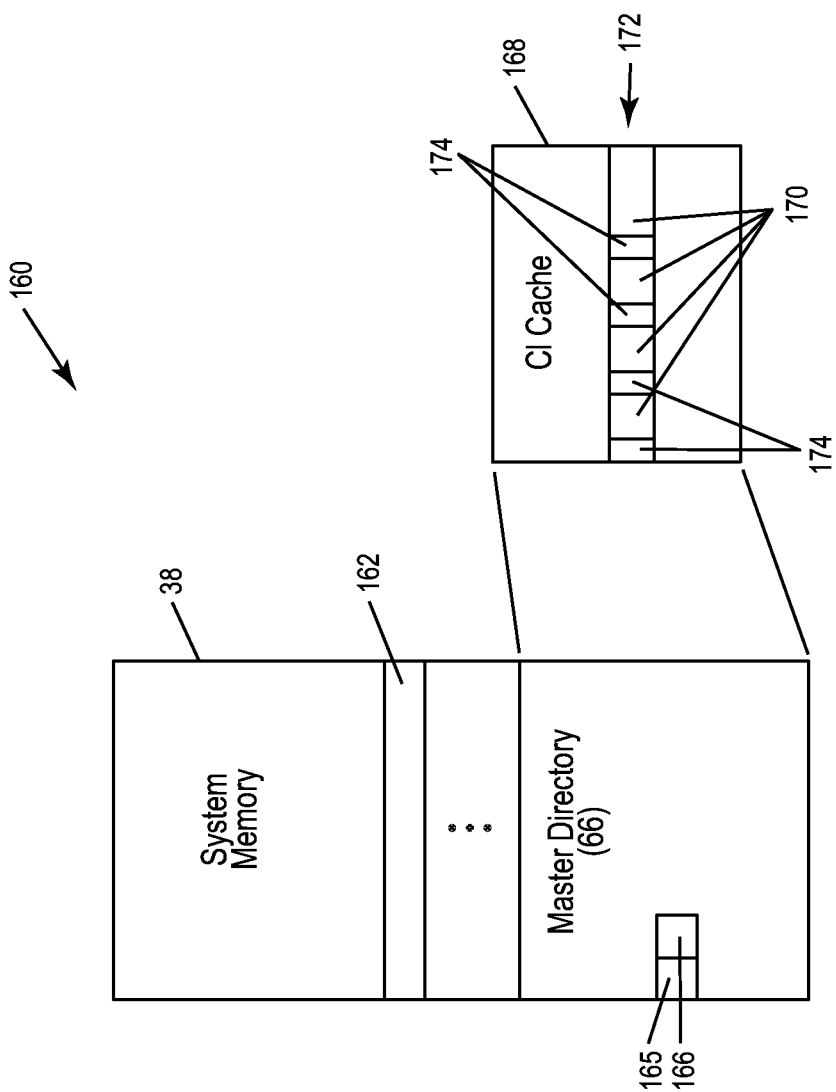
FIG. 13 is a schematic diagram of an exemplary memory bandwidth compression scheme that can be implemented by the compressed memory controller in FIG. 3.

In this regard, FIG. 13 is a schematic diagram of an exemplary memory bandwidth compression scheme 160 that can be implemented by the compressed memory controller 36 in FIG. 3 to provide memory bandwidth compression. In this example of a memory capacity compression scheme, data is stored at a PA location in the system memory 38 in either compressed or uncompressed form. In this regard, the system memory 38 is provided comprised of a plurality of data lines 162. The data lines 162 are accessible by the compressed memory controller 36 by the received PA. An ECC compression indicator 166 is stored in association with each data line 162 to indicate whether the data line 162 is stored in compressed form or not. In this manner, when performing a memory access request to the system memory 38, the compressed memory controller 36 can check the ECC compression indicator 166 associated with the data line 162 corresponding to the PA to be addressed to determine if the data line 162 is compressed as part of processing of the memory access request.

The master directory 66 is also still provided that contains one entry 165 per data line 162 in the system memory 38 corresponding to the PA. The master directory 66 also contain one (1) compression indicator 166 per entry 165 to denote if the data line 162 is stored compressed in the data line 162, and if so, the compression length if there are multiple compression lengths supported. For example, if the data line 162 is 128 bytes in length and the data stored therein can be compressed to 64 bytes or less, the compression indicator 166 in the master directory 66 corresponding to the data stored in the system memory 38 may be set to indicate that the data is stored in the first 64 bytes of the 128 byte data line 162.

With continuing reference to FIG. 13, during a write operation, the compressed memory controller 36 can compress a memory block to be written into the system memory 38. For example, data (e.g., 128 bytes, or 256 bytes) is compressed. If the data block is smaller than or equal to the burst size of the system memory 38 (e.g., 64 bytes), then 64 bytes can be written, otherwise 128 bytes are written. 256 bytes could be written as 64, 128, 192, or 256 bytes, depending on compressed data size. The ECC compression indicator 166 associated with the data line 162 in the system memory 38 can also be set to denote if the data at the data line 162 is compressed or not.

During a read operation example, the compressed memory controller 36 can read part of the data to be accessed from the system memory 38. If the data to be read was compressed in the system memory 38 as indicated by the ECC compression indicator 166, the read operation is done, because the portion of data read is the entire data block but in compressed form. The compressed data can be provided by the compressed memory controller 36 over the internal system bus 22 (FIG. 2) in compressed form to achieve bandwidth compression. If the portion of data read was not compressed in the system memory 38, this has latency impacts, because the additional portions of the memory line to be read must also be read from the system memory 38. A training mechanism can be deployed, for a number of address ranges, in which the system "learns" if it is better to read the data in two accesses from the system memory 38, or if it is better to read the full amount of data from the system memory 38 to avoid the latency impact.

In this example, a compression indicator (CI) cache 168 may also be provided that contains cache entries 170. The CI cache 168 is provided in a separate cache outside of the system memory 38. The CI cache 168 is a cache that contains one cache entry 170 per data line 162 in the system memory 38 to denote if a data line 162 in the system memory 38 is stored in compressed form or not. In this manner, when performing a memory access request to the system memory 38, the compressed memory controller 36 can first check the cache entry 170 in the CI cache 168 corresponding to the PA to be addressed to determine if the data line 162 at the PA in the system memory 38 is compressed as part of processing of the memory access request without having to read the data line 162. Thus, if the CI cache 168 indicates that the data line 162 is stored compressed, the compressed memory controller 36 does not have to read out the entire data line 162, thus reducing latency. If the CI cache 168 indicates that the data line 162 is stored uncompressed, the compressed memory controller 36 can read out the entire data line 162. If a miss occurs in the CI cache 168, the corresponding ECC compression indicator 166 corresponding to the accessed data line 162 in the master directory 66 can be consulted and loaded into the CI cache 168 for subsequent memory access requests to the same PA.

For example, the CI cache 168 may be organized as a regular cache. The CI cache 168 may contain a tag array and may be organized in n-ways, or other ways. The CI cache 168 will have an eviction policy that can be implemented by the compressed memory controller 36. Each cache line 172 in the CI cache 168 can store multiple cache entries 170. Each cache entry 170 contains one compression indicator 174 to indicate if the data line 162 in the system memory 38 associated with the cache entry 170 is compressed, and/or represent options for compression size for the data corresponding to the cache entry 170 (e.g., two (2) cache indicators for four (4) options if data can be compressed to 32, 64, 96, or 128 bytes). Note that in this example, the ECC compression indicator 166 is redundant, because this information is also stored in the compression indicator 174 in the cache entries 170. For example, if the data line 162 is 128 bytes in length and the data stored therein can be compressed to 64 bytes or less, the compression indicator 174 in the cache entry 170 in the CI cache 168 corresponding to the data line 162 in the system memory 38 may be set to indicate that the data is stored in the first 64 bytes of a 128 byte data line 162.

In another example of a read operation when the CI cache 168 is employed, the compressed memory controller 36 maintains the CI cache 168 that remembers, for a number of 128-byte memory blocks in a data line 162, if the data block is compressed (e.g., 1 bit per 128-byte block, or 2-bits per 256-byte block). The CI cache 168 can be addressed per 4K page: one page-address and 32-bit entries for the flags in this example. For a read operation, the CI cache 168 is checked to see if the address to be accessed is contained in the CI cache 168. If the requested data is in the CI cache 168, the compressed memory controller 36 can read the amount of data from the system memory 38 in accordance with the cache entry 170 in the CI cache 168. If the requested data is not in the CI cache 168, there are two exemplary options. Assuming a worst case scenario, the compressed memory controller 36 can read a full cache entry 170 size (e.g., 128 bytes). Alternatively, the compressed memory controller 36 can read in accordance with the two-access read process discussed above. A learning extension can also be employed. If the data to be read is not in the CI cache 168, then CI cache 168 can be updated as follows. A cache entry 170 can be evicted from the CI cache 168 according to known techniques (e.g., LRU, pseudo-LRU, etc.). Note that an evicted cache entry 170 does not need to be written to memory—it can just be removed from the CI cache 168. A new cache entry 170 can be created where all cache entries 170 are set to maximum read size, except for the block that was just read from the system memory 38, which is set to its actual size. As an optimization, this eviction can be skipped if the block that was read from the system memory 38 is uncompressed (i.e., its maximum size).

With continuing reference to FIG. 13, upon a write to a data line 162 in the system memory 38 with the CI cache 168 provided, the compressed memory controller 36 can be configured to always write the compressed size—with the ECC compression indicator 166 to denote if the cache entry 170 was compressed or not in the system memory 38. If the compression indicator 174 is present in the cache entry 170 in the CI cache 168 associated with the data line 162, the compression indicator 174 is updated in the CI cache 168. If the compression indicator 174 is not present in the CI cache 168 for the cache entry 170 associated with the data line 162, the CI cache 168 may be updated. If the compressed length is greater than the bin-size (e.g., 64B), the CI cache 168 is updated. One cache entry 170 is evicted and a new cache line 172 is installed with the CI cache 168 from the master directory 66. The compression indicator 174 for the corresponding data line 162 is updated in the CI cache 168. If the compressed length is less than or equal to the bin-size, the CI cache 168 does not have to be updated, although it may be. For example, the CI cache 168 may be updated with a certain probability (which could be configured to 100%— i.e., always). If this probability is set to 100%, then the master directory 66 may in some cases always be accurate. Otherwise, the master directory 66 will represent a compressed line length that is larger than the actual compressed line length. This is a tradeoff between bandwidth in updating the master directory 66 versus bandwidth savings during memory reads.

With continuing reference to FIG. 13, upon a read from the system memory 38, if the ECC compression indicator 166 is present in the cache entry 170 in the CI cache 168 for the accessed data line 162, this means that the compressed size information for this data line 162 is known. In this regard, the cache line 172 is accessed from the CI cache 168 to determine the read size, and that amount of data can be read from the corresponding data line 162. If the compression indicator 174 is not present in the accessed cache line 172 in the CI cache 168, the compressed memory controller 36 reads the full line size from the system memory 38 and uses the ECC compression indicator 166 to determine if the data is compressed or not. Concurrently, the compressed memory controller 36 may refresh the CI cache 168 from the master directory 66 with a configurable probability (e.g., 10%).

Alternatively, the compressed memory controller 36 could be configured to not employ the ECC compression indicator 166 in the system memory 38. In this example, the master directory 66 will always reflect if a line is compressed or not in the system memory 38. Upon a write transaction to the system memory 38, the compressed data will always be written by the compressed memory controller 36. The compressed memory controller 36 will always update the compression indicator 174 in the CI cache 168, which causes an eviction and the master directory 66 to be accessed, if required. Upon a read transaction to the system memory 38, the compressed memory controller 36 is configured to always read first from the compression indicator 174 in the CI cache 168, and if not present, a cache line 172 will be evicted from the CI cache 168 and the CI cache 168 will be accessed. Then, a line is read from the system memory 38, based on the length specified in the ECC compression indicator 166.

In another example of a read operation, the compressed memory controller 36 could maintain the CI cache 168 that remembers, for a number of 128-byte memory blocks, if a block is compressed (e.g., 1 bit per 128-byte block, or 2-bits per 256-byte block). The CI cache 168 can be addressed per 4K page: one page-address and 32-bit entries for the flags. For a read operation, the CI cache 168 is checked to see if the address to be accessed is contained in the CI cache 168. If the requested data is in the CI cache 168, the compressed memory controller 36 can read the amount of data from the system memory 38 in accordance with the cache entry 170 in the CI cache 168. If the requested data is not in the CI cache 168, there are two exemplary options. Assuming a worst case scenario, the compressed memory controller 36 can read a full cache entry 170 size (e.g., 128 bytes). Alternatively, the compressed memory controller 36 can read in accordance with the two-access read process discussed above. A learning extension can also be employed. If the data to be read is not in the CI cache 168, then CI cache 168 can be updated as follows. A cache entry 170 can be evicted from the CI cache 168 according to known techniques (e.g., LRU, pseudo-LRU, etc.). Note that an evicted cache entry 170 does not need to be written to memory—it can just be removed from the CI cache 168. A new cache entry 170 can be created where all cache entries 170 are set to maximum read size, except for the block that was just read from the system memory 38, which is set to its actual size. As an optimization, this eviction can be skipped if the block that was read from the system memory 38 is uncompressed (i.e., its maximum size).

With continuing reference to FIG. 13, upon a write to the system memory 38, the compressed memory controller 36 can be configured to always write the compressed size—with the ECC compression indicator 166 to denote if the cache entry 170 was compressed or not in the system memory 38. If the compression indicator 174 is present in the CI cache 168 for the accessed cache entry 170, the compression indicator 174 is updated in the CI cache 168. If the compression indicator 174 is not present in the CI cache 168, the CI cache 168 may be updated. If the compressed length is greater than the bin-size (e.g., 64B), the CI cache 168 is updated. One cache entry 170 is evicted and a new cache line 172 is installed with the master directory 66. The compression indicator 174 for the corresponding data line 162 is updated in the CI cache 168. If the compressed length is less than or equal to the bin-size, the CI cache 168 does not have to be updated, although it may be. For example, the CI cache 168 may be updated with a certain probability (which could be configured to 100%—i.e., always). If this probability is set to 100%, then the master directory 66 may in some cases always be accurate. Otherwise, the master directory 66 will represent a compressed line length that is larger than the actual compressed line length. This is a tradeoff between bandwidth in updating the master directory 66 versus bandwidth savings during memory reads.

With continuing reference to FIG. 13, upon a read from the system memory 38, if the ECC compression indicator 166 is present in the CI cache 168 for the accessed data line 162, this means that the compressed size information for this data line 162 is known. In this regard, the cache line 172 is accessed from the CI cache 168 to determine the read size, and that amount of data can be read from the corresponding data line 162. If the compression indicator 174 is not present in the accessed cache line 172 in the CI cache 168, the compressed memory controller 36 reads the full line size from the system memory 38 and uses the ECC compression indicator 166 to determine if the data is compressed or not. Concurrently, the compressed memory controller 36 may refresh the CI cache 168 from the master directory 66 with a configurable probability (e.g., 10%).

Alternatively, the compressed memory controller 36 could be configured to not employ the ECC compression indicator 166 in the system memory 38. In this example, the master directory 66 will always reflect if a line is compressed or not in the system memory 38. Upon a write transaction to the system memory 38, the compressed data will always be written by the compressed memory controller 36. The compressed memory controller 36 will always update the compression indicator 174 in the CI cache 168, which causes an eviction and the master directory 66 to be accessed, if required. Upon a read transaction to the system memory 38, the compressed memory controller 36 is configured to always read first from the compression indicator 174 in the CI cache 168, and if not present, a cache line 172 will be evicted from the CI cache 168 and the master directory 66 will be accessed. Then, a line is read from the system memory 38, based on the length specified in the ECC compression indicator 166.

Figure 14:
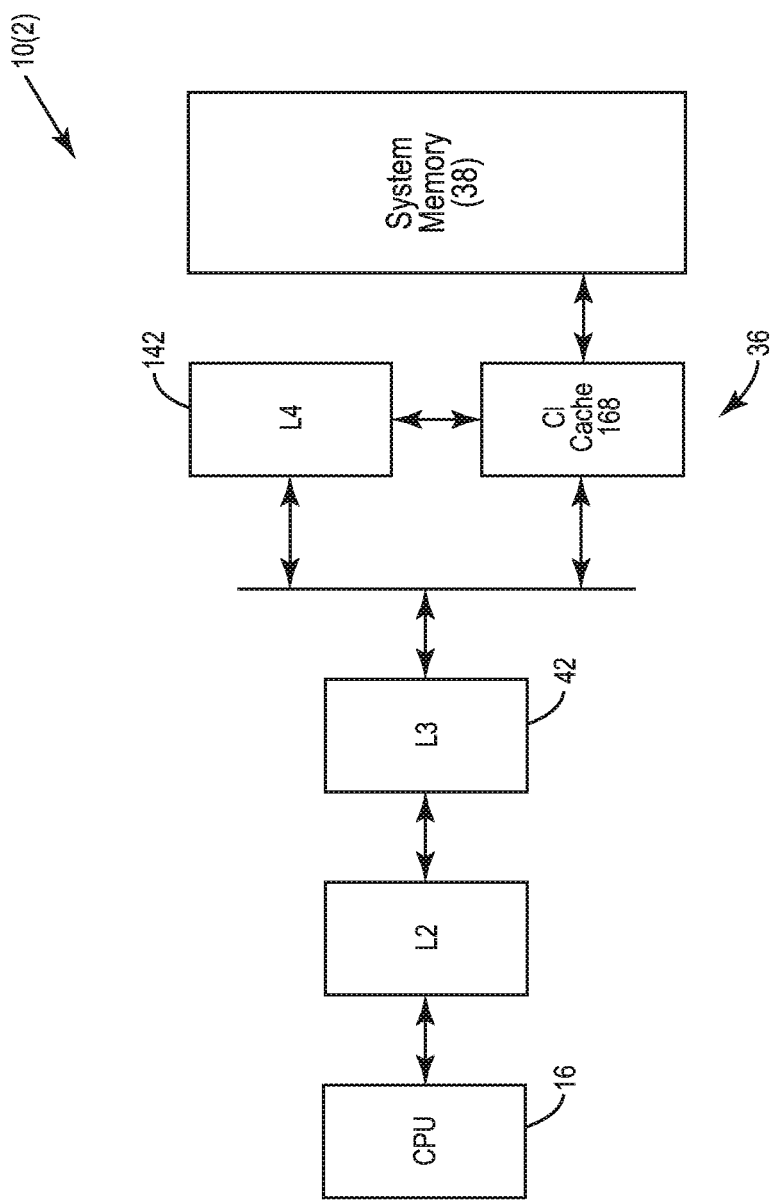
FIG. 14 illustrates an example of the SOC in FIG. 3 that includes an optional L4 cache to compensate for performance loss due to address translation in the compressed memory controller.

It may also be desired to provide an additional cache for memory bandwidth compression scheme. In this regard, FIG. 14 illustrates an example of an alternative SOC 10(2) like the SOC 10' in FIG. 2, but the SOC 10(2) in FIG. 14 additionally includes the optional cache 142, which is an L4 cache in this example. The compressed memory controller 36 can look up a PA in both the L4 cache 142 and the CI cache 168 concurrently to minimize latency. The addresses in the L4 cache 142 are PAs that are uncompressed. Upon a PA hit in the L4 cache 142, the PA lookup in the CI cache 168 is redundant. Upon a PA miss in the L4 cache 142, a PA lookup in the CI cache 168 is required to obtain the data from the system memory 38. Also, to avoid additional latency of the CPU 16 accessing both the L4 cache 142 and the CI cache 168, the L4 cache 142 and the CI cache 168 may be primed similar to the priming described above with regard to FIG. 11B.

As discussed above, it may be desired to provide compression of a memory data block of all 0's as a special case to optimize compression. For example, if a memory data block (e.g., 128 bytes) is all 0's, then data is not read or written, but noted in a separate data structure as all 0's. A zero-bit could be provided in the system memory 38 to denote if a memory line is compressed, thus adding one (1) bit per memory data block. The compressed memory controller 36 could maintain a cache that remembers, for a number of 128-byte memory blocks for example, if a block is all 0's. For a write operation, if a line of a memory data block is all 0's, the compressed memory controller 36 does not write the line to the system memory 38, but the CI cache 168 is updated. For a read operation, the zero-bit in the CI cache 168 is checked for the line. If the line is in the CI cache 168, then depending on the zero-bit, either the line is read from the system memory 38, or all 0's is returned. If the line is not in the CI cache 168, then it is read from the system memory 38. If the line is zero, then the CI cache 168 can be updated. The CI cache 168 can be updated to evict a TLB entry 74 according to known techniques (LRU, pseudo-LRU, etc.). If a line is evicted, all lines that have their zero-bit set need to be written to main memory. This can be organized as a write-all-zeros queue. A possible optimization would be to use two (2) bits, wherein one bit denotes if the line is all-zeros, and another bit denotes if the line is dirty (i.e., has not been written to main memory yet). A background task of the compressed memory controller 36 can inspect the CI cache 168 and queue the lines with dirty-bits in a "write-all-zeros" queue. With the memory capacity compression schemes described above, different memory compression schemes can be employed by the compressed memory controller 36 as desired. For example, it may be desired to employ memory compression schemes that are optimized for small data blocks, such as 64, 128, and 256 bytes, since the cache lines described in the examples above include these sizes as examples.

Figure 15:
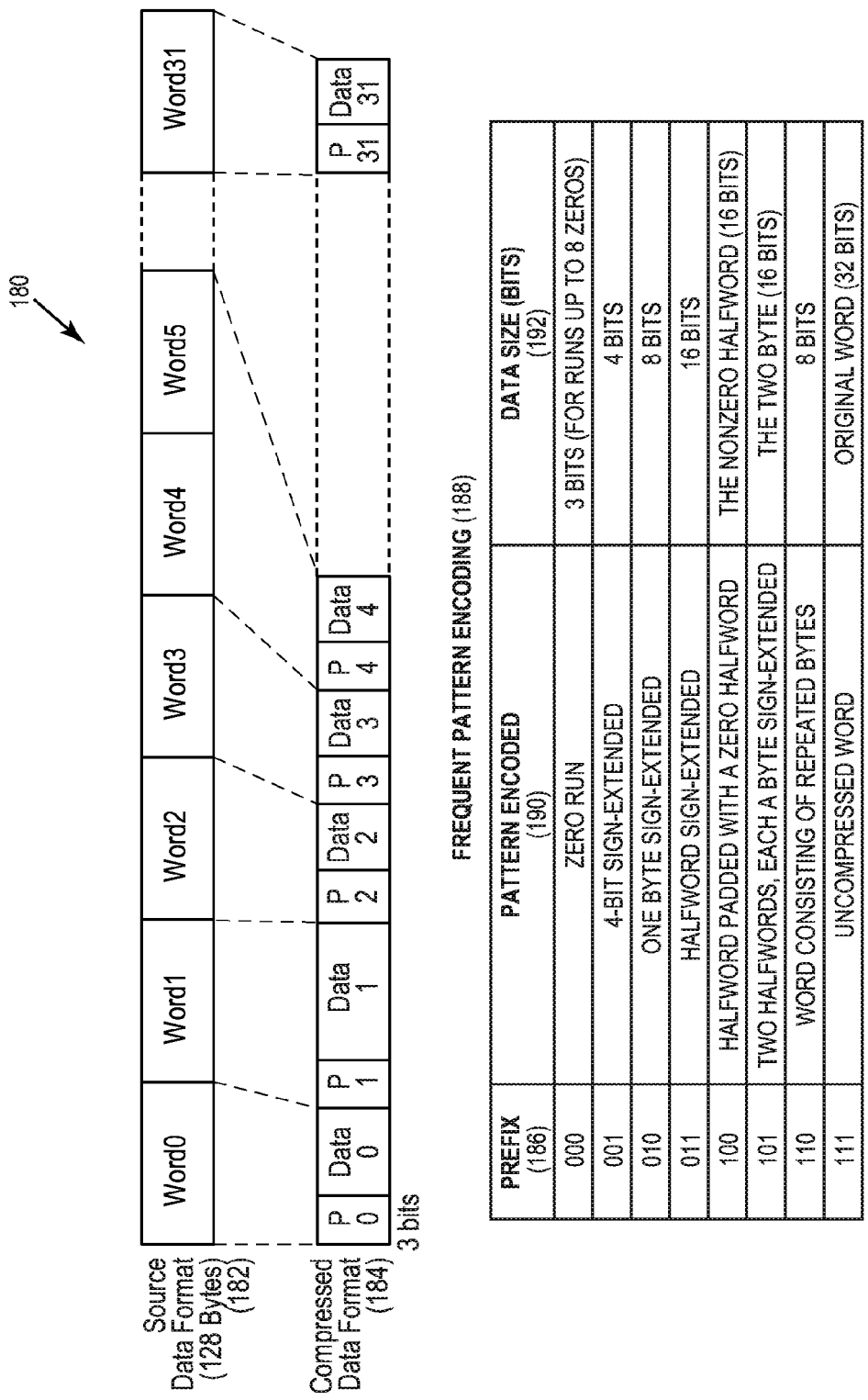

In this regard, FIG. 15 illustrates a frequent pattern compression data compression scheme 180. In this regard, the source data in a source data format 182 to be compressed is shown by example as 128 bytes. A compressed data format 184 is shown below. The compressed data format 184 is provided in a format of prefix codes Px and data behind the prefix as Datax. The prefix is 3-bits. The prefix codes are shown in a prefix code column 186 in a frequent pattern encoding table 188 that shows the pattern encoded in a pattern encoded column 190 for a given prefix code in the prefix code column 186. The data size for the pattern encoded is provided in a data size column 192 of the frequent pattern encoding table 188.

Figure 16:
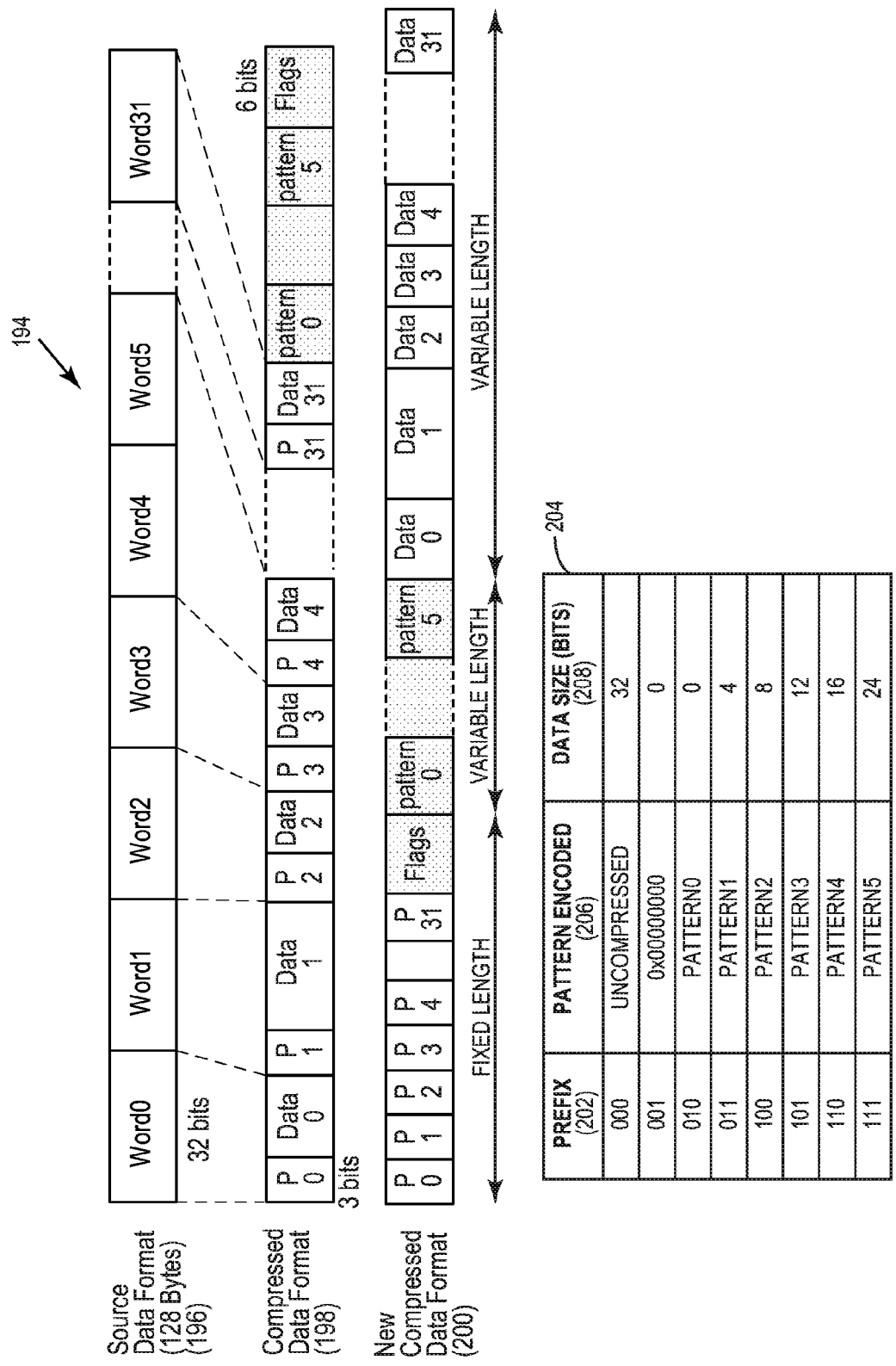

FIG. 16 illustrates a 32-bit frequent pattern compression data compression scheme 194. In this regard, the source data in a source data format 196 to be compressed is shown by example as 128 bytes. A compressed data format 198 is shown below. The compressed data format 198 is provided in a format of prefix Px and data immediately behind the prefix as Datax. A new compressed data format 200 is provided in a different format of prefix codes Px, data Datax, flags, and patterns, which are organized to be grouped together for efficiency purposes. The prefix code is 3-bits. The prefix codes are shown in a prefix code column 202 in a frequency pattern encoding table 204 that shows the pattern encoded in a pattern encoded column 206 for a given prefix code in the prefix code column 202. The data size for the pattern encoded is provided in a data size column 208 of the frequency pattern encoding table 204. The prefix code 000 signifies an uncompressed pattern, which would be data of the full size of 32-bits in the new compressed data format 200. The prefix code 001 signifies an all zero data block, which can be provided as 0 bits in the data of the new compressed data format 200. With a 3-bit prefix, prefix codes 010-111 can be used to encode other specific patterns that are recognized in the source data, which in this example are patterns in 0, 4, 8, 12, 16, and 24 bits respectively.

Figure 17:
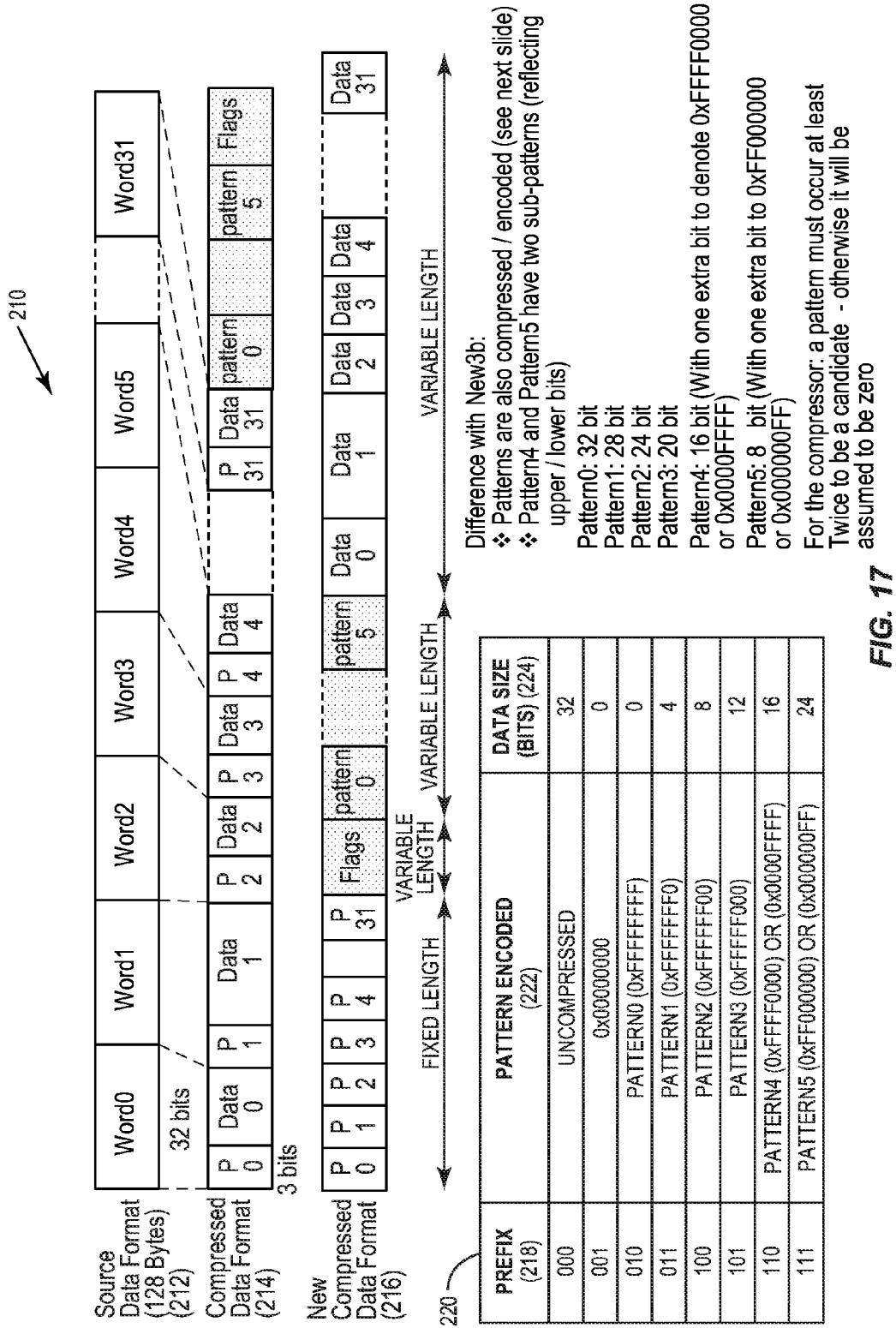

FIG. 17 illustrates an example of 32-bit frequent pattern compression data compression scheme 210. In this regard, the source data in a source data format 212 to be compressed is shown by example as 128 bytes. A compressed data format 214 is shown below. The compressed data format 214 is provided in a format of prefix Px and data behind the prefix as Datax. A new compressed data format 216 is provided in a different format of prefix codes Px, data Datax, flags, and patterns, which are organized to be grouped together for efficiency purposes. The prefix code is 3-bits. The prefix codes are shown in a prefix code column 218 in a frequency pattern encoding table 220 that shows the pattern encoded in a pattern encoded column 222 for a given prefix code in the prefix code column 218. The data size for the pattern encoded is provided in a data size column 224 of the frequency pattern encoding table 220. The prefix code 000 signifies an uncompressed pattern, which would be data of the full size of 32-bits in the new compressed data format 216. The prefix code 001 signifies an all zero data block, which can be provided as 0 bits in the data of the new compressed data format 216. Prefix code 010 signifies pattern 0xFFFFFFFF, which is a specific pattern and thus requires 0-bit data size in the compressed data according to the new compressed data format 216. Other patterns are shown in the frequency pattern encoding table 220 for prefix codes 011-111. The flags field in the new compressed data format 216 indicates which patterns for prefix codes 001-111 are present in the data portions (i.e., Datax) of the compressed data. If the pattern is present in the compressed data, the patterns are stored in the new compressed data format 216 that can then be consulted to recreate the uncompressed data. The data fields include the compressed data according to the prefix code associated with the data field in the new compressed data format 216.

Figure 18:
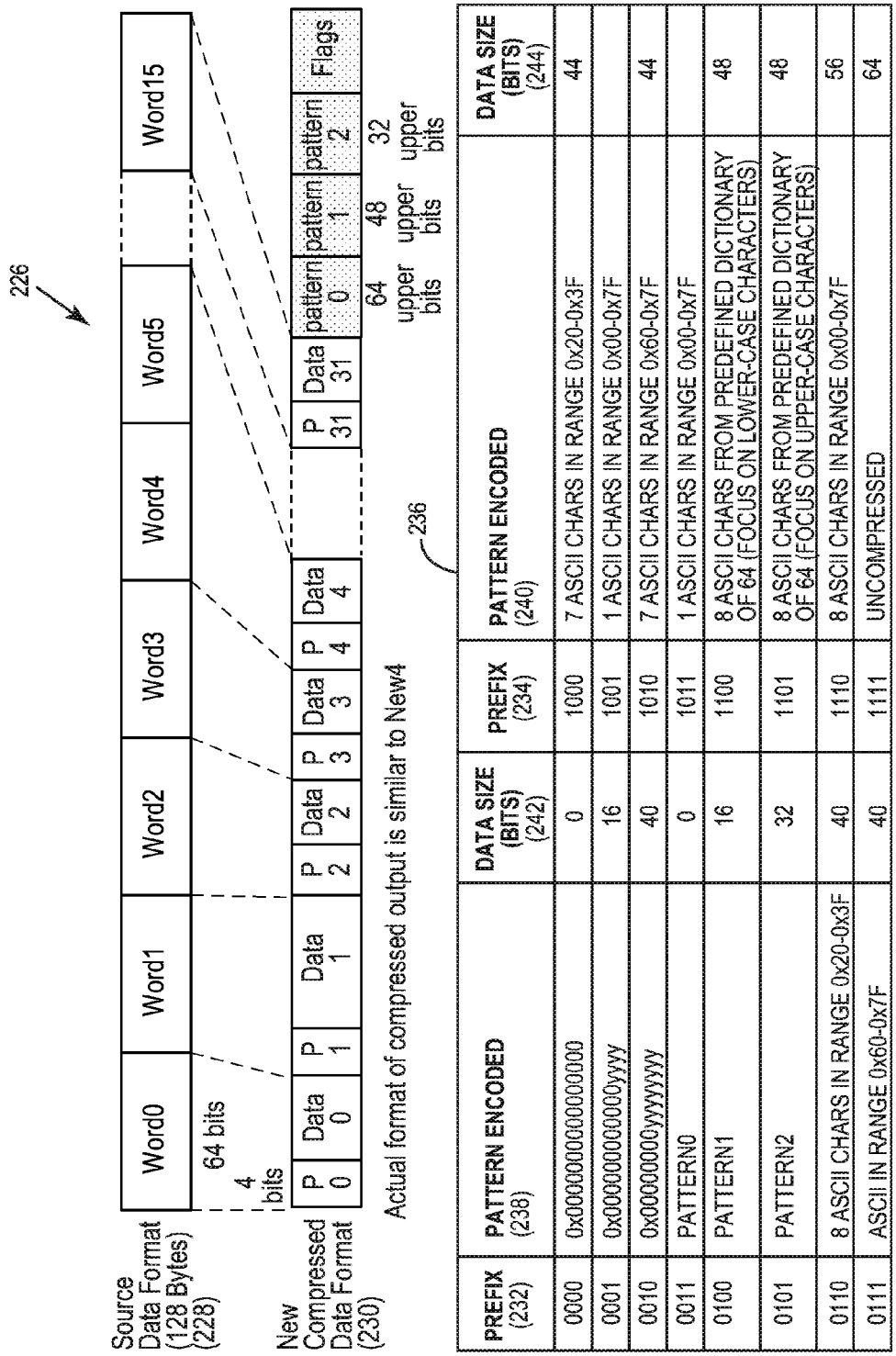

FIG. 18 illustrates another example of 64-bit frequent pattern compression data compression scheme 226. In this regard, the source data in a source data format 228 to be compressed is shown by example as 128 bytes. A new compressed data format 230 is provided in a different format of prefix codes Px, data Datax, flags, and patterns, which are organized to be grouped together for efficiency purposes. The prefix code is 4-bits. The prefix codes are shown in prefix code columns 232, 234 in a frequency pattern encoding table 236 that shows the pattern encoded in pattern encoded columns 238, 240 for a given prefix code in the prefix code columns 232, 234. The data size for the pattern encoded is provided in data size columns 242, 244 of the frequency pattern encoding table 236. The prefix code 0000 signifies an all zero data block, which can be provided as 0 bits in the data of the new compressed data format 230. Other patterns are shown in the frequency pattern encoding table 236 for prefix codes 0001-1111, which include ASCII patterns for frequently occurring ASCII patterns. The flags field in the new compressed data format 230 indicates which patterns for prefix codes 0001-1111 are present in the data portions (i.e., Datax) compressed data. If the pattern is present in the compressed data, the patterns are stored in the new compressed data format 230 that can then be consulted to recreate the uncompressed data. The data fields include the compressed data according to the prefix code associated with the data field in the new compressed data format 230.

Figure 19:
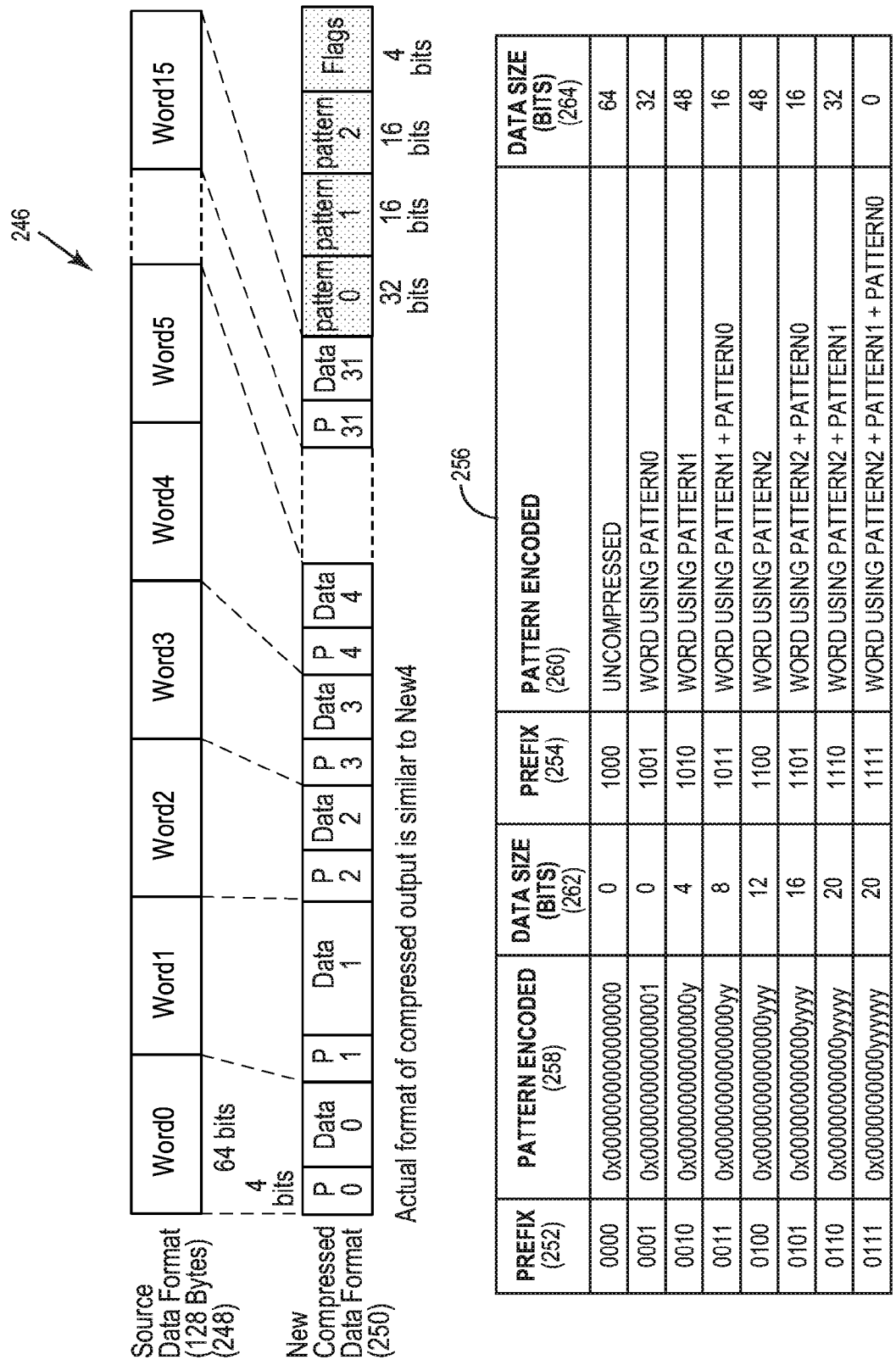

FIG. 19 illustrates another example of 64-bit frequent pattern compression data compression scheme 246. In this regard, the source data in a source data format 248 to be compressed is shown by example as 128 bytes. A new compressed data format 250 is provided in a different format of prefix codes Px, data Datax, flags, and patterns, which are organized to be grouped together for efficiency purposes. The prefix code is 4-bits. The prefix codes are shown in prefix code columns 252, 254 in a frequency pattern encoding table 256 that shows the pattern encoded in pattern encoded columns 258, 260 for a given prefix code in the prefix code columns 252, 254. The data size for the pattern encoded is provided in data size columns 262, 264 of the frequency pattern encoding table 256. The prefix code 0000 signifies an all zero data block, which can be provided as 0 bits in the data of the new compressed data format 250. Other patterns are shown in the frequency pattern encoding table 256 for prefix codes 0001-1111, which can include combinations of fixed patterns. The flags field in the new compressed data format 250 indicates which patterns for prefix does 0001-1111 are present in the data portions (i.e., Datax) in the compressed data. If the pattern is present in the compressed data, the patterns are stored in the new compressed data format 250, which can then be consulted during data compression to recreate the uncompressed data. The prefix code P0-P31 can link to the patterns, which are used along with the corresponding data (Datax) to recreate the full length data in uncompressed format. The data fields include the compressed data according to the prefix code associated with the data field in the new compressed data format 250.

Examples of fixed patterns that can be used with the frequent pattern compression data compression scheme 246 in FIG. 19 is shown in table 266 in FIG. 20, where the fixed patterns are provided in a pattern column 268, with its length in a length column 270 and the definition of the pattern in a pattern definition column 272. The flags definitions are shown in a flag definition table 274 to allow a memory controller, such as compressed memory controller 36, to correlate a given pattern linked to a prefix code to a definition used to create uncompressed data. The flag definition table 274 includes the bits for a given flag in a flags column 276, the value of the bits for a given flag in a flag value column 278, and a flag definition for a given flag in a flag definition column 280.

Figure 21:
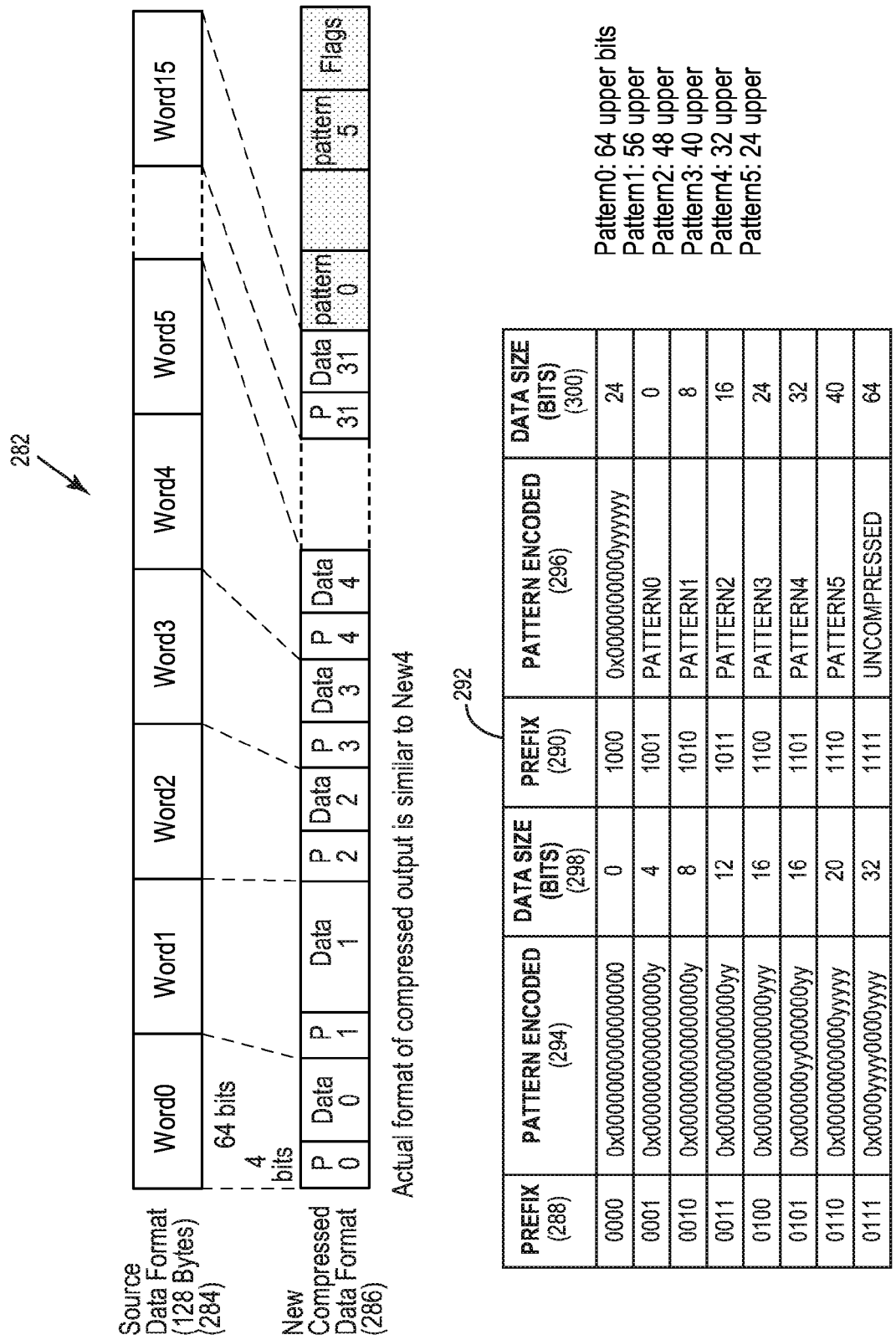

FIG. 21 illustrates another example of 64-bit frequent pattern compression data compression scheme 282. In this regard, the source data in a source data format 284 to be compressed is shown by example as 128 bytes. A new compressed data format 286 is provided in a different format of prefix codes Px, data Datax, flags, and patterns, which are organized to be grouped together for efficiency purposes. The prefix code is 4-bits. The prefix codes are shown in prefix code columns 288, 290 in a frequency pattern encoding table 292 that shows the pattern encoded in pattern encoded columns 294, 296 for a given prefix code in the prefix code columns 288, 290. The data size for the pattern encoded is provided in data size columns 298, 300 of the frequency pattern encoding table 292. The prefix code 0000 signifies an all zero data block, which can be provided as 0 bits in the data of the new compressed data format 286. The prefix code 1111 signifies a data block that is not compressed in the new compressed data format 286. Other patterns are shown in the frequency pattern encoding table 292 for prefix codes 0001-1110, which can include combinations of defined patterns as shown therein. The flags field in the new compressed data format 286 indicates which patterns for prefix codes 0000-1110 are present in the data portions (i.e., Datax) of the compressed data. If the pattern is present in the compressed data, the patterns are stored in the new compressed data format 286 that can then be consulted to recreate the uncompressed data. The new compressed data format 286 is shown as only containing patterns 0-5, because these were the only patterns accounted for in the prefix codes 0000-1110 present in the source data in this example. The data fields include the compressed data according to the prefix code associated with the data field in the new compressed data format 286.

Figure 22:
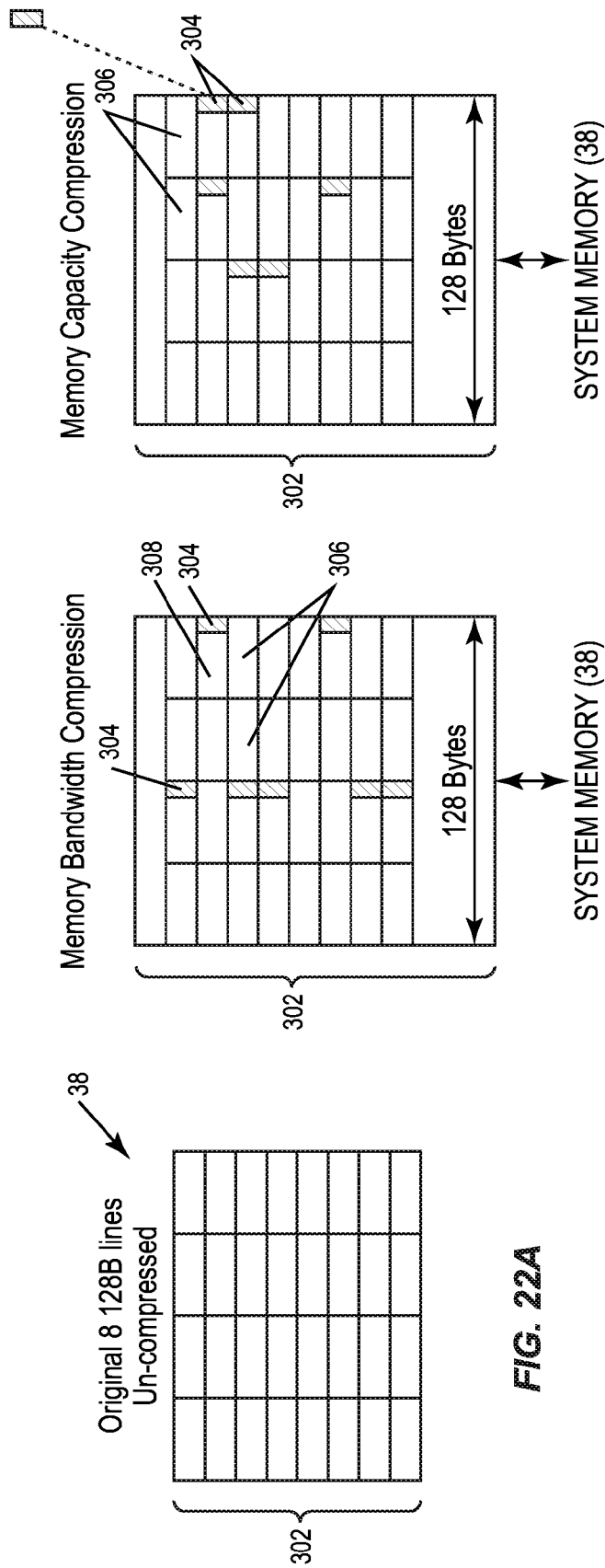
FIG. 22A is an illustration of exemplary memory data organized in memory data blocks/lines in uncompressed form.
FIG. 22B is an illustration of the memory data in FIG. 22A after being compressed by the memory controller employing a memory bandwidth compression scheme with a next read address prefetch scheme.
FIG. 22C is an illustration of the memory data in FIG. 22A after being compressed by the memory controller employing a memory capacity compression scheme with a next read address prefetch scheme.

As discussed above, memory capacity compression and/or memory bandwidth compression schemes can be employed to achieve a desired compression ratio. For example, FIG. 22A is an illustration of exemplary memory data 302 organized in memory data blocks/lines in uncompressed form in the system memory 38 that can be compressed using memory capacity compression and/or memory bandwidth compression schemes to achieve a desired compression ratio. FIG. 22B is an illustration of the memory data 302 in FIG. 22A after being compressed by the compressed memory controller 36 employing a memory bandwidth compression scheme. As discussed in examples above, memory bandwidth compression involves compressing data on a bus to reduce bandwidth on the bus. Reducing bandwidth on a bus can reduce bus latency and power consumption. Further, the memory bandwidth compression scheme does not involve the need for further translation of a PA like performed in the memory capacity compression scheme, because data is stored at the PA location, but just in either compressed or uncompressed form. FIG. 22C is an illustration of the memory data 302 in FIG. 22A after being compressed by the compressed memory controller 36 employing a memory capacity compression scheme. As also discussed in examples above, memory capacity compression involves storing data in memory in compressed form. However, latency may be impacted as a result of this compression due to the additional overhead associated with the compressed memory controller 36. It may be desired to tradeoff some compression efficiency for performance.

In this regard, a next read address prefetching scheme may be combined with the memory bandwidth compression scheme and/or the memory capacity compression scheme, as illustrated respectively in FIGS. 22B and 22C. The next read address prefetching scheme is used by the compressed memory controller 36 to speculatively prefetch data from the system memory 38 at another address beyond the currently accessed PA. The next read address to be prefetched from the system memory 38 can be stored as metadata 304 in association with the memory data 302 stored in the system memory 38 as shown in FIGS. 22B and 22C, since there may be left over space in a memory block 306 that holds compressed memory data. For example, the compressed memory data stored at a particular memory block 306 may not compress down to its memory block 306 boundary, and thus, additional memory space is left over in the memory block 306. For example, if the memory blocks 306 are 32 bytes in size and compressed memory data is compressed down to 50 bytes, then the compressed memory data is stored over two (2) memory blocks 306 of 64 bytes total, with fourteen (14) bytes unused. Thus, when the memory data 302 is addressed in the system memory 38, if a next read address is stored in the metadata 304 associated with a memory block 308, the memory data 302 at the next read address can be prefetched by the compressed memory controller 36 in the system memory 38 to be available in case the next read address is the next PA received by the compressed memory controller 36. Used in conjunction with a memory bandwidth and/or memory capacity compression scheme, additional performance can be achieved while using left over space in the memory blocks 306 in the system memory 38.

Figure 23:
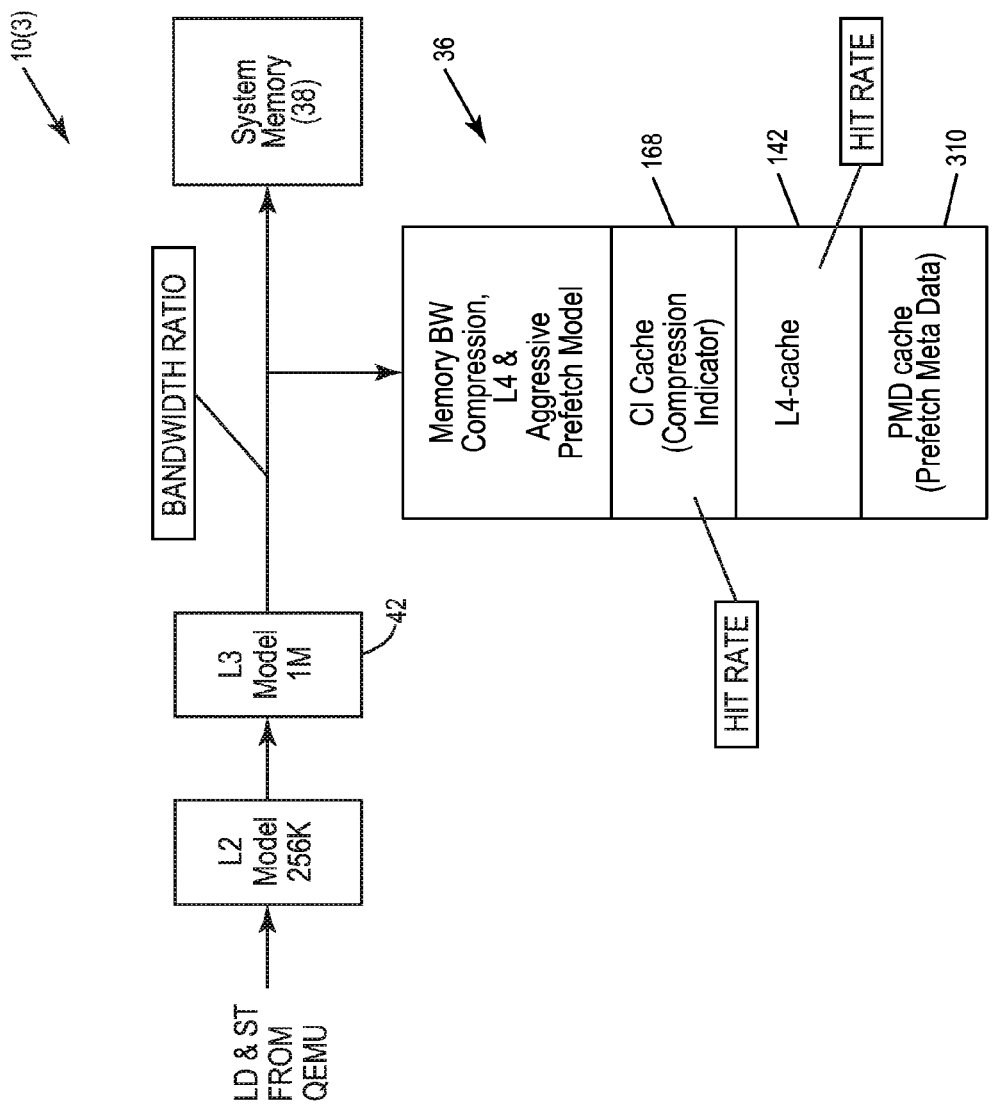
FIG. 23 is an architectural diagram of an alternative SOC to the SOC in FIG. 3, employing an exemplary memory controller configured to perform memory data compression employing a memory capacity compression scheme with a next read address prefetch scheme.
Figures 24A, 24B, 24C:
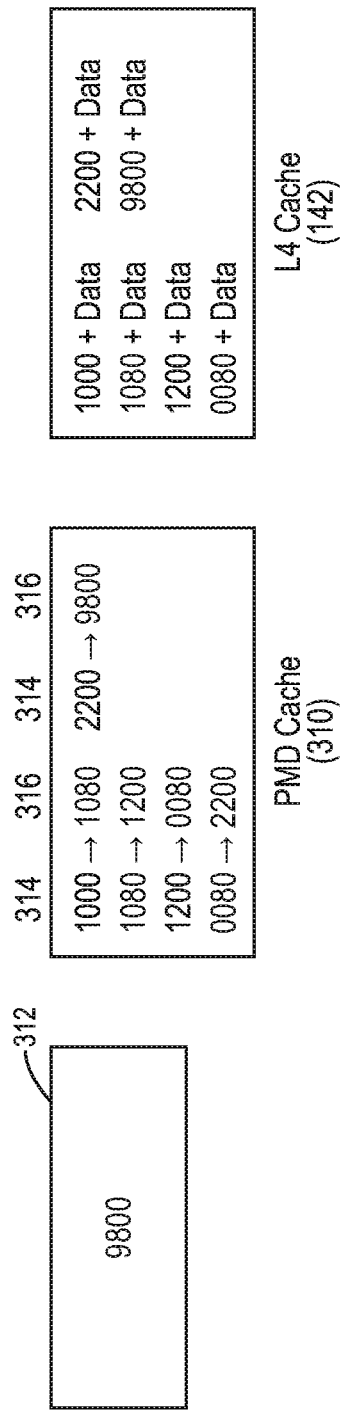
FIGS. 24A-24C are schematic diagrams of exemplary data structures that can be employed in the SOC in FIG. 23 to allow the memory controller to perform memory data compression employing a memory capacity compression scheme with a next read address prefetch scheme.

In this regard, FIG. 23 is an architectural diagram of memory-related components that can be provided in alternative SOC 10(3) to the SOC 10' in FIG. 2, employing the compressed memory controller 36 configured to perform memory data compression employing a memory capacity compression scheme with a next read address prefetch scheme. As shown therein, in this example, a prefetch memory data (PMD) cache 310 is additionally provided. The CI cache 168 is provided to perform a memory bandwidth compression scheme in this example. The optional L4 cache 142 is also provided. FIGS. 24A-24C are schematic diagrams of exemplary data structures that can be employed in the SOC 10(3) of FIG. 23 to allow the compressed memory controller 36 to perform memory data compression by employing a memory capacity compression scheme with a next read address prefetch scheme, which are now discussed. These data structures may be provided for each hardware thread in each CPU 16 (see FIG. 2) so that each hardware thread is capable of providing memory capacity compression.

Figure 25:
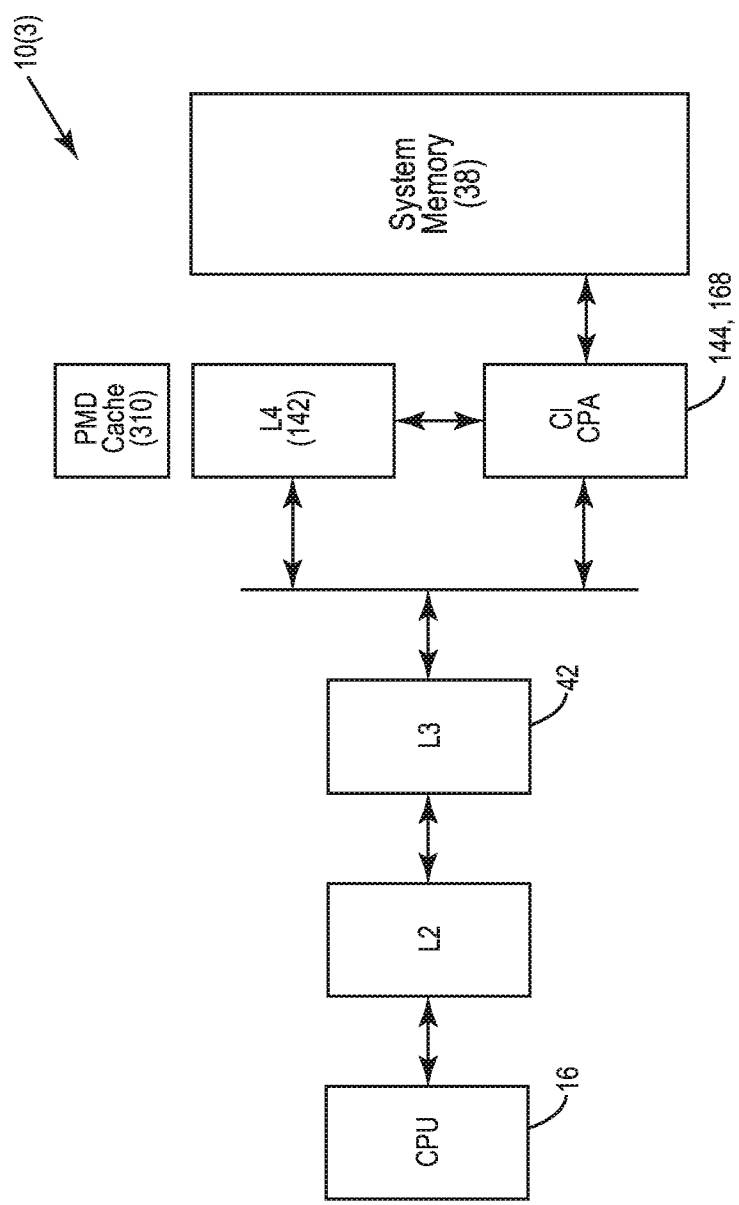
FIG. 25 illustrates the SOC in FIG. 23 that includes an optional cache to provide additional bandwidth reduction.

In this regard, FIG. 24A is a previous address data register 312 that contains the current previous read address to be prefetched from the system memory 38, which in this example is 0x9800. FIG. 24B illustrates the PMD cache 310 with a number of cache lines containing accessed addresses 314 accessed by the compressed memory controller 36 for memory accesses with a next read address 316 stored in association with the accessed addresses 314. FIG. 24C illustrates the L4 cache 142 that may optionally be provided to cache memory data as previously described. FIG. 25 illustrates the memory components for the SOC 10(3) in FIG. 23. With reference back to FIGS. 24A-24C, for example, if an accessed address 314 is 0x1000, initially, no next read address 316 will be associated with this accessed address 314. However, if the next memory addressed received by the compressed memory controller 36 to be accessed is 0x1080, the compressed memory controller 36 stores address 0x1080 in association with accessed address 0x1000 in the PMD cache 310 in this example. Thus, the next time that memory address 0x1000 is provided to the compressed memory controller 36 to be accessed from the system memory 38, the compressed memory controller 36 can perform a lookup in the PMD cache 310 to determine if memory address 0x1000 has an associated next read address 316 to be speculatively prefetched in case the associated next read address 316 is the actual next read address 316 accessed. The PMD cache 310 will eventually be filled as memory address accesses occur.

The compressed memory controller 36 will also store the next read address 316 as metadata 304 in the system memory 38 in association with the compressed PA when compressed data is stored for the compressed PA, as shown in FIGS. 22B and 22C, if there is room available in the memory block at the compressed PA. Thus, the compressed memory controller 36 can access the next read address 316 for an accessed compressed data in the system memory 38 for prefetching if the next read address 316 is not present in the PMD cache 310. The next read address 316 stored in the system memory 38 can also be used for filling the PMD cache 310 upon an eviction in the PMD cache 310, as will be discussed below.

Thus, upon a memory read operation, the compressed memory controller 36 is configured to store the previous read address in association with a current read address in the PMD cache 310. A cache line in the PMD cache 310 will be evicted if necessary. Upon a hit to the L4 cache 142 for a current read address, the compressed memory controller 36 gets the next read address 316 from the PMD cache 310 if a hit occurs when accessing the current read address in the PMD cache 310, to prefetch memory data from the system memory 38 at the next read address 316 into the L4 cache 142. Upon a miss to the L4 cache 142, a cache line is evicted from the L4 cache 142, and data is read at the read address at the compressed PA from the system memory 38 and stored in the L4 cache 142. If the next read address 316 associated with the L4 cache 142 is in the PMD cache 310, the next read address 316 stored in the PMD cache 310 is used to prefetch memory data at the next read address 316. If the next read address 316 associated with the L4 cache 142 is not in the PMD cache 310, the next read address 316 stored in the metadata 304 associated with the compressed PA at the next read address 316 in the system memory 38 is used to prefetch memory data at the next read address 316. In this latter situation, if the next read address 316 in the metadata 304 is valid at the compressed PA in the system memory 38, this next read address 316 will also be stored in the PMD cache 310 in association with the read address being accessed.

Upon a memory write operation, and upon a hit to the L4 cache 142 based on the address to be accessed, the compressed memory controller 36 replaces the old cache line with a new cache line with the memory data accessed from the system memory 38.

Upon any miss to the L4 cache 142, a cache line is evicted from the L4 cache 142, and the next memory data from the system memory 38 is stored in the L4 cache 142. Upon an eviction from the L4 cache 142, a next read address 316 is obtained for the address associated with the evicted cache line in the L4 cache 142 from the PMD cache 310. If the evicted cache line from the L4 cache 142 is dirty, the next read address 316 is written back in the metadata 304 in the system memory 38. Otherwise, if the next read address 316 is dirty, the next read address 316 is written back into the metadata 304 with a configurable probability.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory controller, comprising:
    a memory interface configured to access a system memory; and
    a controller configured to:
        receive a first memory read request comprising a first physical address (PA) to be read in the system memory over a system bus; and
        access the first PA in the system memory to perform the received first memory read request; and
    the controller further configured to:
        receive a next memory read request comprising a next PA to be read in the system memory over the system bus;
        access the system memory based on the next PA to perform the received next memory read request;
        store the next PA in the system memory in association with the first PA; and
        store the next PA in a cache entry associated with the first PA in a prefetch metadata (PMD) cache comprising a plurality of cache entries each comprising a first PA entry and a corresponding next PA entry, the PMD cache communicatively coupled to the memory controller.

2. The memory controller of claim 1, wherein the controller is configured to store the next PA as metadata in a memory block associated with the first PA in the system memory.

3. The memory controller of claim 2, wherein the controller is configured to:
    determine if the memory block associated with the first PA contains available space to store the next PA; and
    store the next PA as the metadata in the memory block associated with the first PA in the system memory, if the memory block associated with the first PA contains the available space for the next PA.

4. The memory controller of claim 3, wherein the available space in the memory block associated with the first PA is based on a size of compressed memory data stored in the memory block.

5. The memory controller of claim 1, wherein the controller is further configured to:
    determine if a current PA for a received memory read request in contained in a repository in response to the controller performing a read operation for the current PA; and
    if the next PA is stored in association with the current PA for the received memory read request in the repository:
        read the next PA associated with the current PA in the system memory; and
        prefetch memory data in the system memory at the next PA to obtain the memory data stored at the next PA as prefetched memory data.

6. The memory controller of claim 5, wherein the controller is further configured to provide the prefetched memory data over the system bus.

7. The memory controller of claim 1, wherein the controller is configured to store the next PA in the cache entry associated with the first PA in the PMD cache among a plurality of PMD caches each associated with a processor core, each of the plurality of PMD caches comprising the plurality of cache entries each comprising the first PA entry and the corresponding next PA entry, the PMD cache communicatively coupled to the memory controller.

8. The memory controller of claim 1, wherein the controller is further configured to:
    determine if a current PA for a received memory read request is contained in the PMD cache; and
    if the current PA is contained in the PMD cache:
        read the next PA associated with the current PA in the PMD cache in response to the controller performing a read operation for the current PA; and
        prefetch memory data in the system memory at the next PA to obtain the memory data stored at the next PA as prefetched memory data.

9. The memory controller of claim 8, wherein the controller is further configured to provide the prefetched memory data stored in the system memory at the next PA for the received memory read request over the system bus.

10. The memory controller of claim 8, wherein, if the current PA for the received memory read request is not contained in the PMD cache, the controller is further configured to:
- access the current PA in the system memory to obtain corresponding memory data stored in the current PA in the system memory; and
- update the cache entry in the PMD cache corresponding to the current PA for the cache entry in the PMD cache in which the prefetched memory data was stored.

11. The memory controller of claim 10, wherein the controller is further configured to:
- determine if there is an available cache entry in the PMD cache; and
- if there is not an available cache entry in the PMD cache, evict the cache entry in the PMD cache to store the current PA in the evicted cache entry in the PMD cache.

12. The memory controller of claim 8, further comprising a data cache comprising a plurality of data cache entries each configured to store memory data in association with an address entry,
wherein the controller is further configured to:
- determine if the current PA matches an address entry in a data cache entry among the plurality of data cache entries in the data cache; and
- if the current PA is contained in the address entry in the data cache entry in the data cache, provide the corresponding memory data stored in the system memory at the current PA in the data cache as the prefetched memory data for the received memory read request.

13. The memory controller of claim 12, wherein, if the current PA is contained in the address entry in the data cache entry in the data cache, the controller is further configured to:
- read the next PA associated with the current PA in the PMD cache; and
- prefetch memory data in the system memory at the next PA to obtain the memory data stored at the next PA as the prefetched memory data for the received memory read request.

14. The memory controller of claim 12, wherein, if the current PA does not match the address entry in the data cache entry in the data cache, the controller is further configured to:
- evict a data cache entry among the plurality of data cache entries in the data cache;
- read the memory data from the system memory at the current PA and store the memory data in the data cache;
- determine if the next PA is contained in the PMD cache; and
- if the next PA is contained in the PMD cache, prefetch memory data from the system memory at the next PA as the prefetched memory data for the received memory read request.

15. The memory controller of claim 14, wherein, if the current PA does not match the address entry in the data cache entry in the data cache, the controller is further configured to:
- access the next PA associated with the current PA in the PMD cache;
- write back the next PA in the system memory associated with the current PA if the evicted data cache entry is dirty; and
- write back the next PA in the system memory associated with the current PA if the next PA associated with the current PA in the PMD cache is dirty with a configurable probability.

16. The memory controller of claim 13, wherein, if the next PA is not contained in the PMD cache, the controller is further configured to:
- read the next PA associated with the current PA in the system memory;
- if the next PA associated with the current PA in the system memory is valid, prefetch the memory data from the system memory at the next PA as the prefetched memory data for the received memory read request; and
- write back the next PA in the PMD cache in association with the current PA.

17. The memory controller of claim 12, wherein the controller is further configured to:
- receive a memory write request comprising a second PA and write memory data to be stored in the system memory over the system bus;
- determine if the second PA matches an address entry in a data cache entry among the plurality of data cache entries in the data cache;
- if the second PA is contained in the address entry in the data cache entry in the data cache, store the write memory data in the data cache associated with the second PA; and
- if the second PA is not contained in the address entry in the data cache entry in the data cache, evict a data cache entry from the data cache and store the write memory data in the data cache associated with the second PA.

18. The memory controller of claim 17, wherein if the second PA is not contained in the address entry in the data cache entry in the data cache, the controller is further configured to:
- access a next PA associated with the second PA in the PMD cache;
- write back the next PA in the system memory associated with the second PA if the evicted data cache entry is dirty; and
- write back the next PA in the system memory associated with the second PA if the next PA associated with the second PA in the PMD cache is dirty with a configurable probability.

19. The memory controller of claim 1 integrated into an integrated circuit (IC).

20. The memory controller of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

21. A memory controller, comprising:
- a means for receiving a first memory read request comprising a first physical address (PA) to be read in a system memory over a system bus;
- a means for accessing the first PA in the system memory to perform the received first memory read request;
- a means for receiving a next memory read request comprising a next PA to be read in the system memory over the system bus;

a means for accessing the system memory based on the next PA in the system memory to perform the received next memory read request;

a means for storing the next PA in the system memory in association with the first PA; and a means for storing the next PA in a cache entry associated with the first PA in a prefetch metadata (PMD) cache comprising a plurality of cache entries each comprising a first PA entry and a corresponding next PA entry, the PMD cache communicatively coupled to the memory controller.

22. A method of compressing data for a memory read request to a system memory in a central processing unit (CPU)-based system, comprising:

receiving a first memory read request comprising a first physical address (PA) to be read in the system memory over a system bus;

accessing the first PA in the system memory to perform the first memory read request;

receiving a next memory read request comprising a next PA to be read in the system memory over the system bus;

accessing the next PA in the system memory to perform the received next memory read request;

storing the next PA in the system memory associated with the first PA; and storing the next PA in a cache entry associated with the first PA in a prefetch metadata (PMD) cache comprising a plurality of cache entries each comprising a first PA entry and a corresponding next PA entry.

23. The method of claim 22, comprising storing the next PA as metadata in a memory block associated with the first PA in the system memory.

24. The method of claim 23, comprising:

determining if the memory block associated with the first PA contains available space to store the next PA; and storing the next PA as the metadata in the memory block associated with the first PA in the system memory if the memory block associated with the first PA contains the available space for the next PA.

25. The method of claim 22, further comprising:

determining if a current PA for a received memory read request is contained in a repository in response to a controller performing a read operation for the current PA; and if the next PA is stored in association with the current PA for the received memory read request in the repository:

reading the next PA associated with the current PA in the system memory; and prefetching memory data in the system memory at the next PA to obtain the memory data stored at the next PA as prefetched memory data.

26. The method of claim 22, further comprising:

determining if a current PA for the received memory read request is contained in the PMD cache in response to a controller performing a read operation for the current PA;

if the current PA is contained in the PMD cache:

reading the next PA associated with the current PA in the PMD cache in response to the controller performing the read operation for the current PA; and prefetching memory data in the system memory at the next PA to obtain the memory data stored at the next PA as prefetched memory data; and providing the prefetched memory data stored in the PMD cache at the next PA for the received memory read request over the system bus.

27. The method of claim 26, wherein, if the current PA for the received memory read request is not contained in the PMD cache, further comprises:

accessing the current PA in the system memory to obtain the corresponding memory data stored in the current PA in the system memory;

updating a cache entry in the PMD cache corresponding to the current PA for the cache entry in the PMD cache in which the prefetched memory data was stored;

determining if there is an available cache entry in the PMD cache; and if there is not an available cache entry in the PMD cache, evicting the cache entry in the PMD cache to store the current PA in the evicted cache entry in the PMD cache.

28. A central processing unit (CPU) system, comprising:

a system bus;

at least one CPU core communicatively coupled to the system bus;

a memory controller communicatively coupled to the system bus;

a system memory communicatively coupled to the system bus, the system memory configured to store memory data;

a prefetch metadata (PMD) cache comprising a plurality of cache entries each comprising an address entry and a corresponding next read address, the PMD cache communicatively coupled to the memory controller;

the memory controller comprising a controller configured to:

receive a first memory read request comprising a first physical address (PA) to be read in the system memory over the system bus; and access the first PA in the system memory to perform the received first memory read request; and the controller further configured to:

receive a next memory read request comprising a next PA to be read in the system memory over the system bus;

access the system memory based on the next PA to perform the received next memory read request;

store the next PA in the system memory in association with the first PA; and store the next PA in a cache entry associated with the first PA in the PMD cache comprising the plurality of cache entries each comprising a first PA entry and a corresponding next PA entry, the PMD cache communicatively coupled to the memory controller.

* * * * *